United States Patent
Iwasa

[11] Patent Number: 6,124,638
[45] Date of Patent: Sep. 26, 2000

[54] SEMICONDUCTOR DEVICE AND A METHOD OF MANUFACTURING THE SAME

[75] Inventor: Shoichi Iwasa, Tokyo, Japan

[73] Assignee: United Microelectronics, Hsinchu, Taiwan

[21] Appl. No.: 08/960,257

[22] Filed: Oct. 29, 1997

[30] Foreign Application Priority Data

Oct. 31, 1996 [JP] Japan .................................. 8-305660

[51] Int. Cl.⁷ .................................................. H01L 29/72
[52] U.S. Cl. ........................ 257/751; 257/384; 257/752; 257/757; 257/768
[58] Field of Search ................................... 257/751, 384, 257/752, 757, 768

[56] References Cited

U.S. PATENT DOCUMENTS 5,907,188  5/1999  Nakajima et al. ...................... 257/751

FOREIGN PATENT DOCUMENTS 3-101253  4/1991  Japan .
3-169022  7/1991  Japan .
4-277622  10/1992  Japan .

*Primary Examiner*—Edward Wojciechowicz
*Attorney, Agent, or Firm*—Pollock, Vande Sande & Amernick

[57] ABSTRACT

A polycide wiring layer constituted by a polysilicon film and a silicide film is used as a bit line of a DRAM. When a memory cell region having an n-type impurity diffusion layer and a peripheral circuit region having a p-type impurity diffusion layer are to be electrically connected through the polysilicon film, a diffusion prevention film consisting of TiSiN or WSiN is formed as an underlying film of the polysilicon film. With this diffusion prevention film, interdiffusion between the n- and p-type impurity diffusion layers can be prevented. In addition, heat resistance at 900° C. or more can be obtained in processes after formation of the diffusion prevention film.

67 Claims, 26 Drawing Sheets

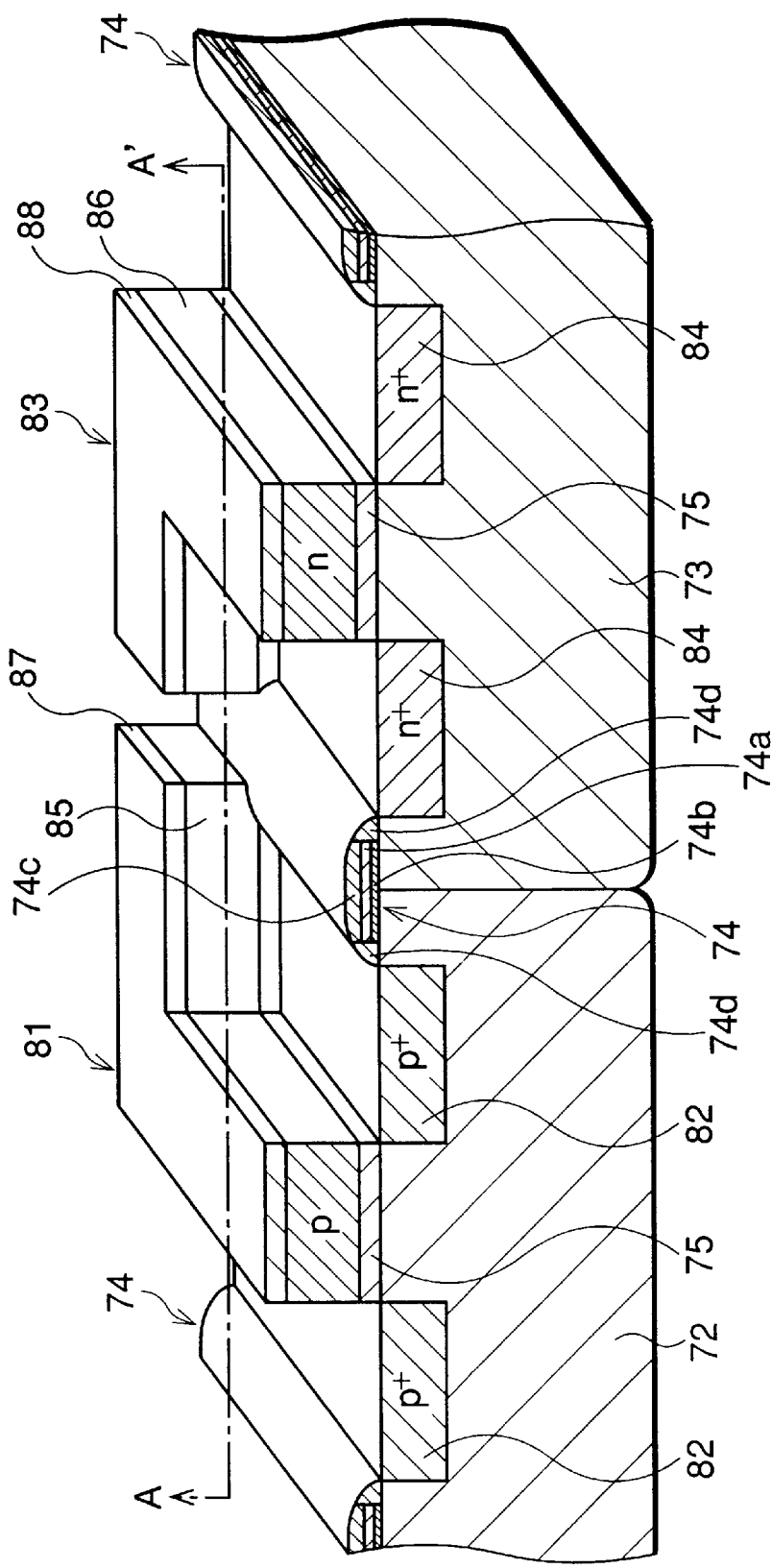

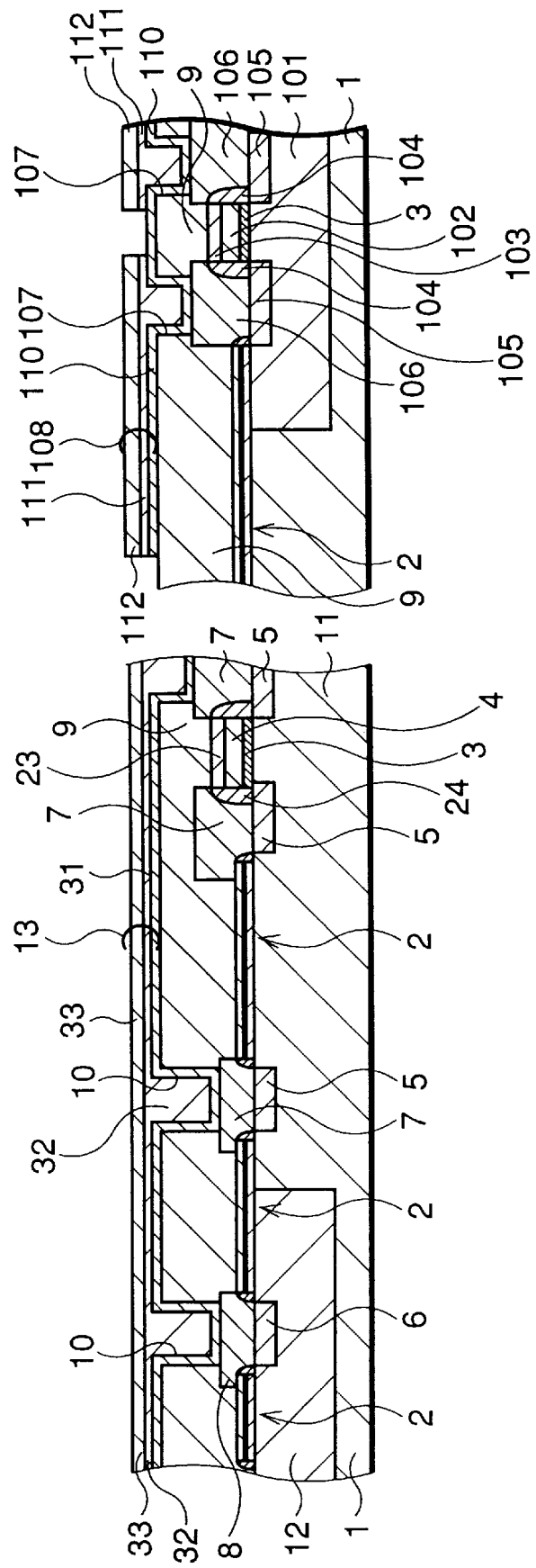

SEMICONDUCTOR DEVICE AND A METHOD OF MANUFACTURING THE SAME

BACKGROUND OF THE INVENTION

1. Field of the Invention

The present invention relates to a semiconductor device and a method of manufacturing the same and, more particularly, to a semiconductor device in which a polycide wiring layer having a polysilicon film and a silicide film is formed as a wiring layer connected to impurity diffusion layers having opposite conductivity types, and a method of manufacturing the same.

2. Description of the Related Art

In recent years, demand for higher integration and higher-speed operation of semiconductor devices such as VLSI memories has arisen, and a technique of forming a polycide wiring layer having a two-layer structure of a polysilicon film and a silicide film, i.e., a compound of silicon (Si) and a refractory metal such as tungsten (W) has been proposed.

For example, Japanese Patent Laid-Open No. 4-277622 discloses a technique of electrically connecting an n-type diffusion layer and a p-type diffusion layer by using a polycide wiring layer having a silicide film of a refractory metal such as WSi in a semiconductor device such as a CMOS inverter having impurity diffusion layers of opposite conductivity types. In this technique, p- and n-type impurities are sequentially ion-implanted into the polysilicon film of the polycide wiring layer by using a photomask, and the polysilicon film is annealed to activate the impurities, thereby forming a polycide wiring layer constituted by p- and n-type portions connecting p- and n-type impurity diffusion layers. This technique is excellent because it enables relaxation of step coverage and reduction of the number of manufacturing processes. However, this technique has the following problem.

When annealing is performed at 800° C. or more in processes after formation of the polycide wiring layer connecting the p- and n-type impurity diffusion layers, the p- or n-type impurity having a high diffusion coefficient and contained in the corresponding one of the two polysilicon films of opposite conductivity types moves in the silicide film and reaches the polysilicon film of a conductivity type opposite to that of the impurity, thus forming a p-n junction. This increases the resistance of the polycide wiring layer or causes an ohmic contact failure between the polysilicon film and the silicide film.

To cope with the above problem, a method is disclosed in, e.g., Japanese Patent Laid-Open No. 3-169022 or 3-101253, in which a polysilicon film is formed by arranging a p-type polycide wiring layer having a p-type polysilicon film connected to a p-type impurity diffusion layer parallel to an n-type polycide wiring layer having an n-type polysilicon film connected to an n-type impurity diffusion layer, and the p-type polysilicon film and the n-type polysilicon film are electrically connected, not directly, but through a low-resistance diffusion prevention film consisting of TiN. According to this technique, the two polycide wiring layers are rendered conductive through the diffusion prevention film having metallic properties. Additionally, impurity diffusion between the polysilicon films of the two polycide wiring layers can be prevented by the diffusion prevention film.

However, the diffusion prevention film of TiN has its crystal structure changed upon high-temperature annealing at a high temperature of 900° C. or more and loses its barrier properties, resulting in damage to its function of preventing impurity diffusion. For this reason, restrictions are applied to annealing conditions after formation of the diffusion prevention film. When this technique is to be applied to manufacture, e.g., a DRAM whose memory cell has a COB (Capacitor Over Bitline) structure using a polycide wiring layer as a bit line of the DRAM, high-temperature annealing at 900° C. or more is required to form an upper insulating interlayer or a dielectric film, so the diffusion prevention film of TiN cannot be used as a lower wiring layer. Instead, for example, a polycide wiring layer (n-type polycide wiring layer) is formed only on the n-type impurity diffusion layer side. When both the p- and n-type polycide wiring layers are to be positively formed, a diffusion prevention film is formed between each polycide wiring layer and a tungsten plug connected to each polycide wiring layer, as disclosed in Japanese Patent Laid-Open No. 3-169022. In this case, TiSiN is not formed because of a reaction at the interface between TiN and the polysilicon film. The crystal structure of TiN changes, and the barrier properties are lost.

When a diffusion prevention film is to be formed, as disclosed in Japanese Patent Laid-Open No. 3-169022, high-temperature annealing can be performed without posing any problems in the formation of a memory capacitor or an insulating interlayer covering the memory capacitor because the diffusion prevention film is formed after formation of the memory capacitor. However, since an upper insulating interlayer must be formed after formation of the diffusion prevention film, the problem of high-temperature annealing is still left unsolved.

SUMMARY OF THE INVENTION

It is an object of the present invention to provide a reliable semiconductor device for which high-temperature annealing in processes after formation of a polycide layer is enabled without adversely affecting the polycide layer or a diffusion prevention film and a method of manufacturing the same.

According to an aspect of the present invention, there is provided a semiconductor device in which a p-type well and an n-type well are formed in a semiconductor substrate, an n-channel transistor having an n-type impurity diffusion layer is formed in the p-type well, and a p-channel transistor having a p-type impurity diffusion layer is formed in the n-type well, comprising an insulating interlayer deposited over the semiconductor substrate and having openings for exposing surface portions of the n- and p-type impurity diffusion layers, a refractory and conductive diffusion prevention film containing silicon. The diffusion prevention film covers a surface of the insulating interlayer including the inside of the openings to prevent interdiffusion of n- and p-type impurities. A polycide wiring layer constituted by a polysilicon film is deposited on the diffusion prevention film to fill the openings with the diffusion prevention film intervened and a silicide film is deposited on the polysilicon film, the polycide wiring layer electrically connecting the n-type impurity diffusion layer and the p-type impurity diffusion layer.

According to another aspect of the present invention, there is provided a semiconductor device in which a p-type well and an n-type well are formed in a semiconductor substrate, an n-channel transistor having an n-type impurity diffusion layer is formed in the p-type well, and a p-channel transistor having a p-type impurity diffusion layer is formed in the n-type well, comprising a first insulating interlayer deposited over the semiconductor substrate and having first openings for exposing surface portions of the n- and p-type impurity diffusion layers. A first polycide wiring layer constituted by a first polysilicon film having an n conductivity type and is patterned on the first insulating interlayer to fill the first opening for exposing the surface portion of the n-type impurity diffusion layer, and a first silicide film is patterned on the first polysilicon film together with the first polysilicon film. A second polycide wiring layer constituted by a second polysilicon film having an p conductivity type is patterned on the first insulating interlayer to fill the first opening for exposing the surface portion of the p-type impurity diffusion layer. A second silicide is film patterned on the second polysilicon film together with the second polysilicon film, the second polycide wiring layer being electrically isolated from the first polycide wiring layer on the first insulating interlayer. A second insulating interlayer is deposited over the first and second polycide wiring layers and having second openings for exposing surface portions of the first and second silicide films, a refractory and conductive diffusion prevention film containing silicon is provided, the diffusion prevention film covering at least inner walls of the second openings to prevent interdiffusion of n- and p-type impurities. An upper wiring layer is deposited on the second insulating interlayer to fill the second openings with the diffusion prevention film intervened, the upper wiring layer being electrically connected to the n- and p-type impurity diffusion layers through the diffusion prevention film and the first and second polycide wiring layers.

According to still another aspect of the present invention, there is provided a semiconductor device having a first region of a first conductivity type, a second region of a second conductivity type opposite to the first conductivity type, and first and second impurity diffusion layers formed by doping an impurity of the second conductivity type into an element active region of the first region and an impurity of the first conductivity type into an element active region of the second region, comprising a wiring layer having a conductive film and a silicide film of a refractory metal, and a refractory and conductive diffusion prevention film containing silicon, the diffusion prevention film preventing interdiffusion of the impurities of the first and second conductivity types, wherein the wiring layer is electrically connected to the first and second impurity diffusion layers through the diffusion prevention film.

According to still another aspect of the present invention, there is provided a semiconductor device having a first region of a first conductivity type, a second region of a second conductivity type opposite to the first conductivity type, and first and second impurity diffusion layers formed by doping an impurity of the second conductivity type into an element active region of the first region and an impurity of the first conductivity type into an element active region of the second region, comprising a first insulating interlayer deposited over the semiconductor substrate and having first openings for exposing surface portions of the first and second impurity diffusion layers. A first wiring layer constituted by a first conductive film having the second conductivity type is patterned on the first insulating interlayer to fill the first opening for exposing the surface portion of the first impurity diffusion layer, and a first silicide film is patterned on the first conductive film together with the first conductive film. A second wiring layer constituted by a second conductive film having the first conductivity type is patterned on the first insulating interlayer to fill the first opening for exposing the surface portion of the second impurity diffusion layer, and a second silicide film is patterned on the second conductive film together with the second conductive film, the second wiring layer being electrically isolated from the first wiring layer on the first insulating interlayer. A second insulating interlayer is deposited over the first and second wiring layers and has second openings for exposing surface portions of the first and second silicide films. A refractory and conductive diffusion prevention film containing silicon is provided, the diffusion prevention film covering at least inner walls of the second openings to prevent interdiffusion of the impurities of the first and second conductivity types. An upper wiring layer is deposited on the second insulating interlayer to fill the second openings with the diffusion prevention film intervened, the upper wiring layer being electrically connected to the first and second impurity diffusion layers through the diffusion prevention film and the first and second wiring layers.

According to still another aspect of the present invention, there is provided a semiconductor device in which a p-type well and an n-type well are formed in a semiconductor substrate, an n-channel transistor having a first gate electrode structure and a pair of n-type impurity diffusion layers on both sides of the first gate electrode structure is formed in the p-type well, and a p-channel transistor having a second gate electrode structure and a pair of p-type impurity diffusion layers on both sides of the second gate electrode structure is formed in the n-type well, wherein the first gate electrode structure is constituted, as a polycide layer, by a first polysilicon film having an n conductivity type and a first silicide film patterned on the first polysilicon film together with the first polysilicon film. The second gate electrode structure is constituted, as a polycide layer, by a second polysilicon film having a p conductivity type and a second silicide film patterned on the second polysilicon film together with the second polysilicon film. A refractory and conductive diffusion prevention film containing silicon is integrally formed on the first silicide film and the second silicide film to prevent interdiffusion of p- and n-type impurities, and the first gate electrode structure and the gate electrode structure are electrically connected through the diffusion prevention film.

According to still another aspect of the present invention, there is provided a semiconductor device having a first region of a first conductivity type, a second region of a second conductivity type opposite to the first conductivity type, a first transistor having a first gate electrode structure and a pair of first impurity diffusion layers of the second conductivity type on both sides of the first gate electrode structure in the first region, and a second transistor having a second gate electrode structure and a pair of second impurity diffusion layers of the first conductivity type on both sides of the second gate electrode structure in the second region, wherein the first gate electrode structure is constituted by a first conductive film having the second conductivity type and a first silicide film patterned on the first conductive film together with the first conductive film. The second gate electrode structure is constituted by a second conductive film having the first conductivity type and a second silicide film patterned on the second conductive film together with the second conductive film. A refractory and conductive diffusion prevention film containing silicon is integrally formed on the first silicide film and the second silicide film to prevent interdiffusion of impurities of the first and second conductivity types, and the first gate electrode structure and the second gate electrode structure are electrically connected through the diffusion prevention film.

According to still another aspect of the present invention, there is provided a semiconductor device comprising a plurality of memory cells each having an access transistor including a first gate electrode and a pair of first impurity diffusion layers and a memory capacitor including a lower electrode connected to one of the pair of first impurity diffusion layers and an upper electrode opposing the lower electrode with a dielectric film intervened therebetween, an output transistor having a second gate electrode and a pair of second impurity diffusion layers of a conductivity type opposite to that of the upper electrode of the memory capacitor. A wiring layer is provided for electrically connecting the upper electrode and one of the pair of second impurity diffusion layers of the output transistor, the wiring layer having a two-layer structure of a conductive film and a silicide film. A refractory and conductive diffusion prevention film containing silicon is formed on one of an upper and lower surface of the wiring layer to prevent interdiffusion of impurities of opposite conductivity types, wherein the output transistor fixes the upper electrode at a predetermined potential.

According to still another aspect of the present invention, there is provided a method of manufacturing a semiconductor device, comprising the first step of forming a p-type well and an n-type well in a surface region of a semiconductor substrate, the second step of doping an impurity of an n conductivity type into an element active region of the p-type well and an impurity of a p conductivity type into an element active region of the n-type well, thereby forming an n-type impurity diffusion layer in the element active region of the p-type well and a p-type impurity diffusion layer in the element active region of the n-type well, the third step of depositing an insulating interlayer over the semiconductor substrate, the fourth step of forming openings for exposing surface portions of the n- and p-type impurity diffusion layers, the fifth step of forming a refractory and conductive diffusion prevention film containing silicon to cover a surface of the insulating interlayer including the inside of the openings, the sixth step of forming a polysilicon film on the diffusion prevention film to fill the openings with the diffusion prevention film intervened, and the seventh step of forming a silicide film on the polysilicon film to form a polycide wiring layer constituted by the polysilicon film and the silicide film and electrically connected to the n- and p-type impurity diffusion layers through the diffusion prevention film.

According to still another aspect of the present invention, there is provided a method of manufacturing a semiconductor device, comprising the first step of forming, in a surface region of a semiconductor substrate, a first region where a first impurity is doped and a second region where a second impurity of a conductivity type opposite to that of the first impurity is doped, the second step of doping the impurity of the second conductivity type into an element active region of the first region and the impurity of the first conductivity type into an element active region of the second region, thereby forming a first impurity diffusion layer in the element active region of the first region and a second impurity diffusion layer in the element active region of the second region, the third step of depositing an insulating interlayer over the semiconductor substrate, the fourth step of forming openings for exposing surface portions of the first and second impurity diffusion layers, the fifth step of forming a refractory and conductive diffusion prevention film containing silicon to cover a surface of the insulating interlayer including the inside of the openings, the sixth step of forming a conductive film on the diffusion prevention film to fill the openings with the diffusion prevention film intervened, and the seventh step of forming a silicide film on the conductive film to form a wiring layer constituted by the silicide film and the conductive film and electrically connected to the first and second impurity diffusion layers through the diffusion prevention film.

According to still another aspect of the present invention, there is provided a method of manufacturing a semiconductor device, comprising the first step of forming a p-type well and an n-type well in a surface region of a semiconductor substrate, the second step of depositing a first insulating interlayer over the semiconductor substrate, the third step of forming first openings for exposing surface portions of the p- and n-type wells of the semiconductor substrate, the fourth step of depositing a polysilicon film on the first insulating interlayer to fill the first openings, the fifth step of doping an n-type impurity into the polysilicon film on the p-type well side and a p-type impurity into the polysilicon film on the n-type well side, thereby forming an n-type impurity diffusion layer in the p-type well of the semiconductor substrate and a p-type impurity diffusion layer in the n-type well of the semiconductor substrate, the sixth step of forming a silicide film to cover the polysilicon film, the seventh step of patterning the polysilicon film and the silicide film to form a first polycide wiring layer electrically connected to the n-type impurity diffusion layer and a second polycide wiring layer electrically connected to the p-type impurity diffusion layer, the first and second polycide wiring layers being electrically isolated from each other on the first insulating interlayer between the p-type well and the n-type well, the eighth step of depositing a second insulating interlayer over the first and second polycide wiring layers, the ninth step of forming second openings in the second insulating interlayer to expose surface portions of the silicide films of the first and second polycide wiring layers, the tenth step of forming a refractory and conductive diffusion prevention film containing silicon to cover at least inner walls of the second openings, and the eleventh step of forming an upper wiring layer on the second insulating interlayer with the diffusion prevention film intervened therebetween to fill the second openings.

According to still another aspect of the present invention, there is provided a method of manufacturing a semiconductor device having a first region of a first conductivity type, a second region of a second conductivity type opposite to the first conductivity type, and first and second impurity diffusion layers formed by doping an impurity of the second conductivity type into an element active region of the first region and an impurity of the first conductivity type into an element active region of the second region, comprising the steps of patterning a wiring layer having a conductive film and a silicide film of a refractory metal, forming a refractory and conductive diffusion prevention film containing silicon, the diffusion prevention film preventing interdiffusion of the impurities of the first and second conductivity types, and electrically connecting the wiring layer to the first and second impurity diffusion layers through the diffusion prevention film.

According to still another aspect of the present invention, there is provided a method of manufacturing a semiconductor device, comprising the first step of forming a first region of a first conductivity type and a second region of a second conductivity type opposite to the first conductivity type in a semiconductor substrate, the second step of depositing a first insulating interlayer over the semiconductor substrate, the third step of forming first openings to expose surface portions of the first and second regions of the semiconductor substrate, the fourth step of depositing a prospective conductive thin film on the first insulating interlayer to fill the first openings, the fifth step of doping an impurity of the second conductivity type into the prospective conductive thin film on the first region side and an impurity of the first conductivity type into the prospective conductive thin film on the second region side, thereby forming conductive films of the second and first conductivity types and first and second impurity diffusion layers, the sixth step of forming a silicide film to cover the conductive films, the seventh step of patterning the conductive films and the silicide film to form first and second wiring layers electrically connected to the first and second impurity diffusion layers, respectively, the first and second wiring layers being electrically isolated from each other on the first insulating interlayer between the first region and the second region, the eighth step of depositing a second insulating interlayer over the first and second wiring layers, the ninth step of forming second openings in the second insulating interlayer to expose surface portions of the silicide films of the first and second wiring layers, the tenth step of forming a refractory and conductive diffusion prevention film containing silicon to cover at least inner walls of the second openings, and the eleventh step of forming an upper wiring layer on the second insulating interlayer with the diffusion prevention film intervened therebetween to fill the second openings.

According to still another aspect of the present invention, there is provided a method of manufacturing a semiconductor device, comprising the first step of forming a p-type well and an n-type well in a surface region of a semiconductor substrate, the second step of sequentially forming a gate insulating film and a polysilicon film on the semiconductor substrate, the third step of doping an n-type impurity into the polysilicon film on the p-type well side and a p-type impurity into the polysilicon film on the n-type well side, the fourth step of forming a silicide film on the polysilicon film, the fifth step of patterning the silicide film, the polysilicon film, and the gate insulating film to form a first gate electrode structure constituted by the n-type polysilicon film and the silicide film on the p-type well and a second gate electrode structure constituted by the p-type polysilicon film and the silicide film on the n-type well, the sixth step of doping the n-type impurity into a surface region of the p-type well on both sides of the first gate electrode structure and the p-type impurity into a surface region of the n-type well on both sides of the second gate electrode structure, thereby forming n-type impurity diffusion layers in the p-type well and p-type impurity diffusion layers in the n-type well, the seventh step of forming an insulating interlayer to bury the first and second gate electrode structures, the eighth step of removing a surface of the insulating interlayer until surfaces of the first and second gate electrode structures are exposed and planarizing the insulating interlayer, and the ninth step of forming a refractory and conductive diffusion prevention film containing silicon on the insulating interlayer to electrically connect the first gate electrode structure and the second gate electrode structure through the diffusion prevention film.

According to still another aspect of the present invention, there is provided a method of manufacturing a semiconductor device, comprising the first step of forming a first region of a first conductivity type and a second region of a second conductivity type opposite to the first conductivity type in a surface region of a semiconductor substrate, the second step of sequentially forming a gate insulating film and a prospective conductive thin film on the semiconductor substrate, the third step of doping an impurity of the second conductivity type into the prospective conductive thin film on the first region side and an impurity of the first conductivity type into the prospective conductive thin film on the second region side to form conductive films of the second and first conductivity types, the fourth step of forming a silicide film on the conductive films, the fifth step of patterning the silicide film, the conductive films, and the gate insulating film to form, on the first region, a first gate electrode structure constituted by the conductive film of the second conductivity type and the silicide film and, on the second region, a second gate electrode structure constituted by the conductive film of the first conductivity type and the silicide film, the sixth step of doping the impurity of the second conductivity type into a surface region of the first region on both sides of the first gate electrode structure and the impurity of the first conductivity type into a surface region of the second region on both sides of the second gate electrode structure, thereby forming first impurity diffusion layers in the first region and second impurity diffusion layers in the second region, the seventh step of forming an insulating interlayer to bury the first and second gate electrode structures, the eighth step of removing a surface of the insulating interlayer until surfaces of the first and second gate electrode structures are exposed and planarizing the insulating interlayer, and the ninth step of forming a refractory and conductive diffusion prevention film containing silicon on the insulating interlayer to electrically connect the first gate electrode structure and the second gate electrode structure through the diffusion prevention film.

According to still another aspect of the present invention, there is provided a method of manufacturing a semiconductor device comprising memory cells each having an access transistor including a first gate electrode and a pair of first impurity diffusion layers, and a memory capacitor including a lower electrode connected to one of the pair of first impurity diffusion layers and an upper electrode opposing the lower electrode and capacitively coupled to the lower electrode through a dielectric film, comprising the steps of, in formation of the access transistor, simultaneously forming an output transistor having a second gate electrode and a pair of second impurity diffusion layers, forming a refractory and conductive diffusion prevention film containing silicon to be connected to one of the pair of second impurity diffusion layers of the output transistor, forming a conductive film of the same conductivity type as that of the upper electrode on the diffusion prevention film, forming a silicide film on the conductive film, and before formation of the lower electrode of the memory capacitor, forming a first contact hole for the lower electrode and a second contact hole over the diffusion prevention film simultaneously, and in formation of the upper electrode, connecting the upper electrode and the silicide film through the second contact hole.

According to still another aspect of the present invention, there is provided a semiconductor device comprising a first semiconductor layer containing an n-type impurity, a second semiconductor layer containing a p-type impurity, and a third semiconductor layer for connecting the first semiconductor layer and the second semiconductor layer, wherein the third semiconductor layer has a refractory and conductive diffusion prevention film containing silicon, the diffusion prevention film preventing at least interdiffusion of the n- and p-type impurities.

In the semiconductor device of the present invention, a refractory and conductive diffusion prevention film containing silicon is formed as a diffusion prevention film for preventing interdiffusion of the impurity of the first conductivity type (p-type) and the impurity of the second conductivity type (n-type). The wiring layer of, e.g., polycide is electrically connected to the impurity diffusion layers of the first and second conductivity types through the diffusion prevention film. The diffusion prevention film has an excellent heat resistance and never suffer peel-off or junction leakage even in high-temperature annealing. Therefore, when a semiconductor device which requires high-temperature annealing after formation of the polycide wiring layer and the diffusion prevention film, e.g., a DRAM having a COB structure using the polycide wiring layer as a bit line is to be formed, disadvantages due to high-temperature annealing can be prevented, including non-ohmic contact between the impurity diffusion layers of opposite conductivity types, destruction of barrier properties of the diffusion prevention film, and an increase in resistance.

According to the present invention, high-temperature annealing in processes after formation of a polycide layer is enabled without adversely affecting the polycide layer or a diffusion prevention film, so that a reliable semiconductor device can be provided.

BRIEF DESCRIPTION OF THE DRAWINGS

FIGS. 8A to 8C are schematic perspective views and FIGS. 8D to 8F are schematic sectional views showing steps in manufacturing the CMOS inverter according to the third embodiment of the present invention;

FIGS. 11A to 11F are schematic sectional views showing steps in manufacturing the DRAM according to the fourth embodiment of the present invention.

DETAILED DESCRIPTION OF THE PREFERRED EMBODIMENTS

Some embodiments of the present invention will be described below in detail with reference to the accompanying drawings.
First Embodiment The first embodiment will be described. In the first embodiment, a DRAM having a MOS transistor serving as an access transistor and a memory capacitor, and a method of manufacturing the DRAM will be exemplified.

Figure 1:
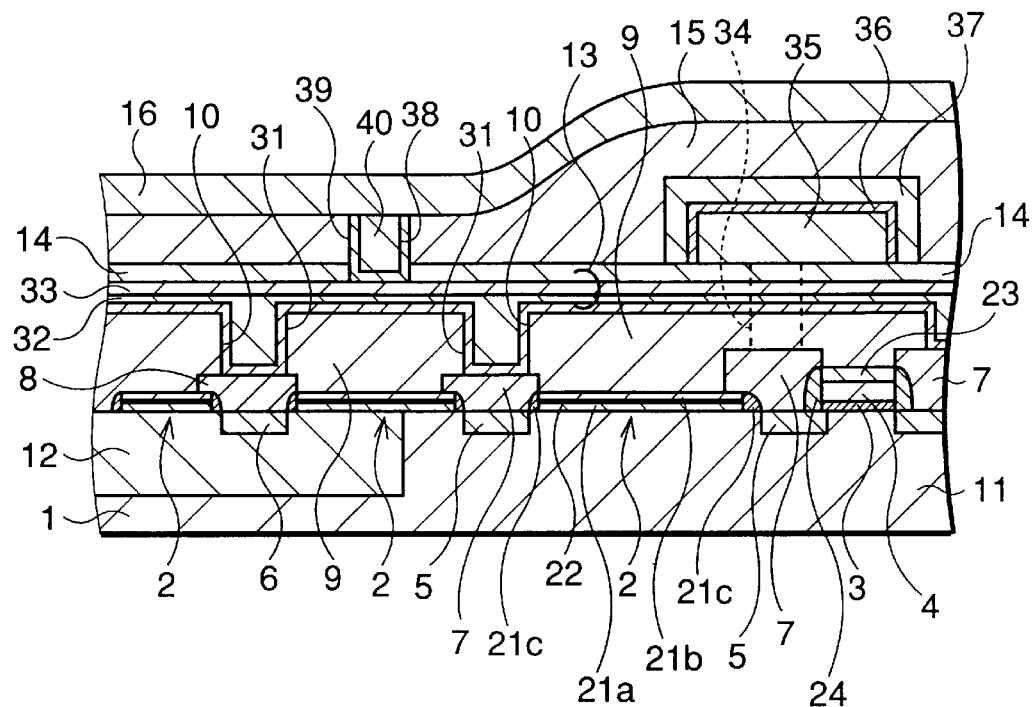
FIG. 1 is a schematic sectional view showing a DRAM according to the first embodiment of the present invention.

FIG. 1 is a schematic sectional view showing the main portion of the memory cell region and part of the peripheral circuit region of the DRAM according to the first embodiment. This DRAM has a so-called COB (Capacitor Over Bitline) structure in which a memory capacitor is substantially formed above a bit line in the memory cell region. This DRAM has, in its memory cell region, an access transistor and a memory capacitor electrically connected to one of a pair of impurity diffusion layers of the access transistor. The DRAM also has, in its peripheral circuit region, a MOS transistor having a pair of impurity diffusion layers of a conductivity type opposite to that of the impurity diffusion layers of the access transistor.

The access transistor in the memory cell region is an nMOS transistor formed on a p-type well 11 formed in a p-type silicon semiconductor substrate 1. The nMOS transistor is formed in an element active region demarcated by a field shield element isolation structure 2 on the p-type well 11.

The MOS transistor in the peripheral circuit region is a pMOS transistor formed on an n-type well 12 formed in the silicon semiconductor substrate 1. The pMOS transistor is formed in an element active region (not shown) demarcated by the field shield element isolation structure 2 on the n-type well 12.

The field shield element isolation structure 2 is formed in the following manner. A shield plate electrode 22 consisting of a polysilicon film is patterned on a shield gate oxide film 21a formed by thermally oxidizing the silicon semiconductor substrate 1. A cap insulating film 21b consisting of a silicon oxide film is formed on the upper surface of the shield plate electrode 22, and a side wall protective film 21c consisting of the silicon oxide film is formed on the side surface of the shield plate electrode 22, so that the shield plate electrode 22 is buried in the silicon oxide films. The field shield element isolation structure 2 has a function of electrically isolating element active regions from each other by fixing the potential of the shield plate electrode 22. Instead of the field shield element isolation structure 2, a field oxide film may be formed by so-called LOCOS as an element isolation structure for demarcating element active regions.

In the memory cell region, gate oxide films 3 are formed in the element active regions on the p-type well 11 and the n-type well 12 of the silicon semiconductor substrate 1, and a gate electrode 4 consisting of polysilicon and having a predetermined pattern is formed on each gate oxide film 3. A cap insulating film 23 is formed on the upper surface of the gate electrode 4, and a side wall protective film 24 as an insulating film is formed on the side surface of the gate electrode 4, so that the gate electrode 4 is covered with the cap insulating film 23 and the side wall protective film 24.

In the peripheral circuit region as well, the gate electrode 4 is patterned on the gate oxide film 3, as in the memory cell region, although not illustrated.

N-type impurity diffusion layers 5 serving as source and drain diffusion layers are formed in the surface region of the silicon semiconductor substrate 1 on both sides of each gate electrode 4 formed on the p-type well 11. In addition, p-type impurity diffusion layers 6 serving as source and drain diffusion layers are formed in the surface region of the silicon semiconductor substrate 1 on both side of each gate electrode 4 on the n-type well 12. The gate electrode 4 and the pair of n-type impurity diffusion layers 5 form the nMOS transistor, i.e., the access transistor in the memory cell region, and the gate electrode 4 and the pair of p-type impurity diffusion layers 6 form the pMOS transistor, i.e., the MOS transistor in the peripheral circuit region.

To relax the positional accuracy in formation of contact holes in the n- and p-type impurity diffusion layers 5 and 6, n- and p-type pad polysilicon films 7 and 8 for extracting contacts are patterned on the surface of the silicon semiconductor substrate 1 where the n- and p-type impurity diffusion layers 5 and 6 are formed. More specifically, an n-type impurity is doped in the silicon semiconductor substrate 1 through an undoped pad polysilicon film in the memory cell region, and a p-type impurity is doped in the silicon semiconductor substrate 1 through an undoped pad polysilicon film in the peripheral circuit region, thereby forming the pad polysilicon films 7 and 8 and simultaneously the n- and p-type impurity diffusion layers 5 and 6. These pad polysilicon films 7 and 8 extend from the cap insulating film 23 and the side wall protective film 24, which cover each gate electrode 4, to the field shield element isolation structure 2 or the space between the field shield element isolation structures 2. The pad polysilicon films 7 and 8 are isolated from each other on the cap insulating film 23 and the side wall protective film 24 or the field shield element isolation structure 2.

An insulating interlayer 9 consisting of a BPSG film (boro-phospho silicate glass film) is formed on the entire surface of the memory cell region and the peripheral circuit region. The pad polysilicon films 7 are buried in the insulating interlayer 9. Contact holes 10 serving as bit contacts are formed in the insulating interlayer 9 to partially expose the surface of the n-type pad polysilicon film 7 formed on one of the pair of n-type impurity diffusion layers 5 in the memory cell region and the surface of the p-type pad polysilicon film 8 formed on one of the pair of p-type impurity diffusion layers 6 in the peripheral circuit region. A polycide wiring layer 13 serving as a bit line is patterned on the insulating interlayer 9 to fill the contact hole 10.

The polycide wiring layer 13 has a two-layer structure in which a silicide film 33 of a refractory metal is stacked on an n-type (or p-type) polysilicon film 32. The polycide wiring layer 13 is formed on the insulating interlayer 9 with a refractory and conductive diffusion prevention film 31 serving as an underlying film intervened therebetween.

The diffusion prevention film 31 is an underlying film consisting of TiSiN or WSiN containing silicon. The diffusion prevention film 31 covers the surface of the insulating interlayer 9 and the inner wall (i.e., the side wall corresponding to the exposed surface of the insulating interlayer 9 and the bottom surface corresponding to the exposed surface of the pad polysilicon film 7 or 8) of each contact hole 10. The polycide wiring layer 13 is formed on the diffusion prevention film 31. The diffusion prevention film 31 prevents interdiffusion of the n-type impurity in the n-type impurity diffusion layers 5 (and the n-type pad polysilicon films 7 connected to the n-type impurity diffusion layers 5) in the memory cell region and the p-type impurity in the p-type impurity diffusion layers 6 (and the pad polysilicon films 8 connected to the p-type impurity diffusion layers 6) in the peripheral circuit region. The polycide wiring layer 13 is electrically connected to one of the pair of n-type impurity diffusion layers 5 in the memory cell region and one of the pair of p-type impurity diffusion layers 6 in the peripheral circuit region through the diffusion prevention film 31 and the pad polysilicon films 7 and 8 to serve as a bit line.

A cap insulating film 14 is deposited to cover the polycide wiring layer 13. In the memory cell region, a contact hole 34 serving as a storage contact is formed in the cap insulating film 14 and the insulating interlayer 9 to partially expose the surface of the n-type pad polysilicon film 7 formed on the other of the pair of n-type impurity diffusion layers 5 which is not connected to the polycide wiring layer 13. The memory capacitor in the memory cell region is formed on the cap insulating film 14.

The memory capacitor is formed by sequentially forming a storage node electrode 35 consisting of polysilicon, a dielectric film 36 consisting of, e.g., an ONO composite film, and a cell plate electrode 37 consisting of polysilicon and patterning these films into a predetermined shape. The storage node electrode 35 fills the contact hole 34 and is electrically connected to the other of the pair of n-type impurity diffusion layers 5 through the n-type pad polysilicon film 7.

An insulating interlayer 15 consisting of a BPSG film is deposited on the memory capacitor and the cap insulating film 14 to cover the memory capacitor. A contact hole 38 is formed in the insulating interlayer 15 and the cap insulating film 14 to partially expose the surface of the silicide film 33 of the polycide wiring layer 13.

An underlying protective film 39 consisting of TiN is formed on the inner wall (i.e., the side wall corresponding to the exposed surface of the insulating interlayer 15 and the bottom surface corresponding to the exposed surface of the silicide film 33) of the contact hole 38. In addition, a tungsten plug (W plug) 40 is formed to fill the contact hole 38 with the underlying protective film 39 intervened. Instead of TiN, TiSiN or WSiN may be used for the underlying protective film 39. When an additional wiring layer is to be formed on the underlying protective film 39, TiSiN or WSiN is preferably used.

An aluminum wiring layer 16 consisting of, e.g., an aluminum alloy is patterned on the entire surface of the insulating interlayer 15 including the exposed upper surface of the W plug 40. The aluminum wiring layer 16 is electrically connected to the polycide wiring layer 13 through the W plug 40.

An insulating interlayer consisting of a BPSG film or the like is formed to cover the aluminum wiring layer 16, thus constituting a DRAM.

Figure 2:
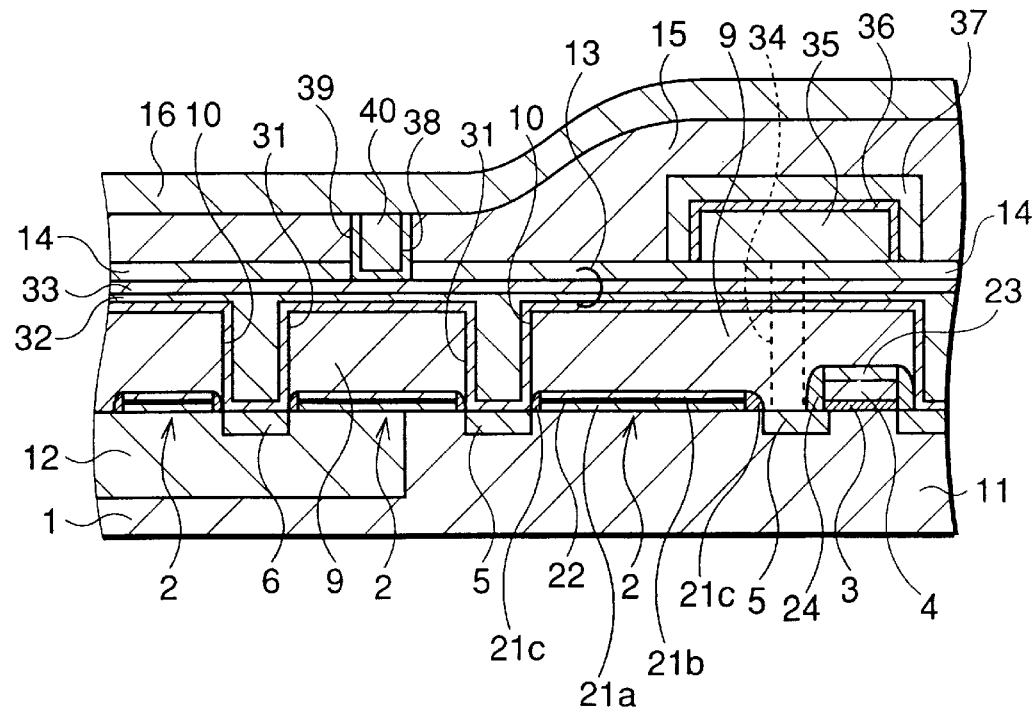
FIG. 2 is a schematic sectional view showing another example of the DRAM according to the first embodiment of the present invention.

In the first embodiment, the DRAM having the pad polysilicon films 7 and 8 patterned on the impurity diffusion layers 5 and 6 has been exemplified. However, the present invention is not limited to this. As shown in FIG. 2, the memory cell region of the DRAM may be formed such that the contact holes 10 are formed to expose the surface of the silicon semiconductor substrate 1 where the impurity diffusion layers 5 and 6 are formed, and the polycide wiring layer 13 is connected to the impurity diffusion layers 5 and 6 through the diffusion prevention films 31 in the contact holes 10. Also the storage node electrode 35 may be connected to the n-type impurity diffusion layer 5 through the contact hole 34.

As described above, in the DRAM of the first embodiment, the refractory and conductive diffusion prevention film 31 containing silicon is formed as a diffusion prevention film for preventing interdiffusion of the n- and p-type impurities in the n- and p-type impurity diffusion layers 5 and 6. The polycide wiring layer 13 is electrically connected to the impurity diffusion layers 5 and 6 through the diffusion prevention film 31. The diffusion prevention film 31 has an excellent heat resistance and never suffers peel-off or junction leakage even in high-temperature annealing. Therefore, even when a semiconductor device which requires high-temperature annealing after formation of the polycide wiring layer 13 and the diffusion prevention film 31, e.g., a DRAM having a COB structure using the polycide wiring layer 13 as a bit line is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

The method of manufacturing the DRAM of the first embodiment will be described next. FIGS. 3A to 3F are schematic sectional views showing steps in manufacturing the DRAM. The same reference numerals as in FIG. 1 denote the same parts in FIGS. 3A to 3F.

Figure 3A:
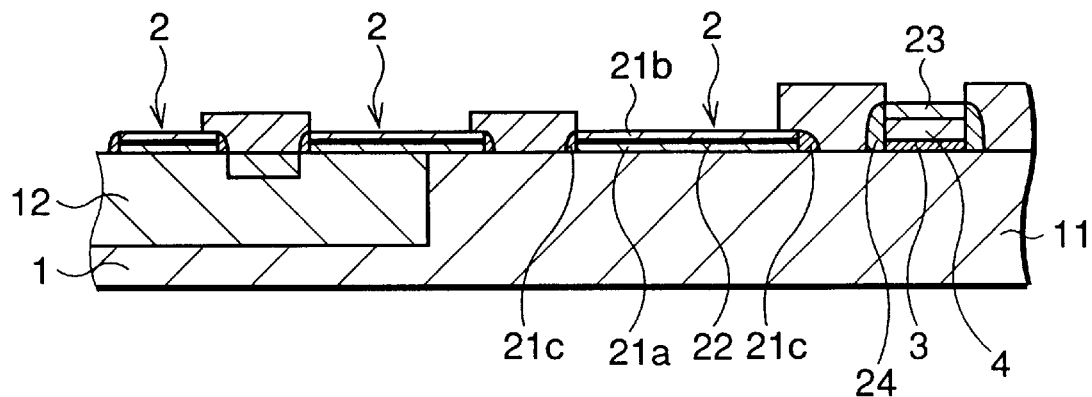
FIGS. 3A to 3F are schematic sectional views showing steps in manufacturing the DRAM according to the first embodiment of the present invention.

As shown in FIG. 3A, an n-type impurity is doped into the surface region of the p-type silicon semiconductor substrate 1 to form the n-type well 12 having an island shape. The region of the silicon semiconductor substrate 1 outside the n-type well 12 becomes the p-type well 11. The peripheral circuit region is formed on the n-type well 12, and the memory cell region is formed on the p-type well 11.

The field shield element isolation structure 2 is formed on the surface of the silicon semiconductor substrate 1. The element active regions in the memory cell region and the peripheral circuit region are demarcated by the field shield element isolation structure 2.

More specifically, a shield gate oxide film 21a is formed by thermally oxidizing the surface of the silicon semiconductor substrate 1 in the memory cell region and the peripheral circuit region. Thereafter, the polysilicon film 22 and the silicon oxide film 21b are sequentially formed.

The shield gate oxide film 21a, the polysilicon film 22, and the silicon oxide film 21b are patterned and selectively removed by photolithography and dry etching or the like, thereby demarcating the element active regions.

A silicon oxide film is formed on the entire surface to cover the remaining shield gate oxide film 21a, polysilicon film 22, and silicon oxide film 21b. The entire surface is anisotropically dry-etched by RIE or the like to leave the silicon oxide on the side surfaces of the shield gate oxide film 21a, the polysilicon film 22, and the silicon oxide film 21b, thereby forming the side wall protective film 21c.

With this process, the field shield element isolation structure 2 having the shield plate electrode 22 consisting of a polysilicon film surrounded by a silicon oxide film is formed in the memory cell region and the peripheral circuit region.

In each of the element active regions in the memory cell region and the peripheral circuit region, the gate oxide film 3 is formed by thermal oxidizing the surface of the silicon semiconductor substrate 1, CVD, or the like. A polysilicon film is deposited on the entire surface of the gate oxide film 3 by CVD or the like and patterned by photolithography and dry etching or the like, thereby forming the gate electrode 4 on the gate oxide film 3.

A silicon oxide film is deposited on the entire surface by CVD or the like to cover the gate electrode 4. The entire surface of the silicon oxide film is anisotropically dry-etched by RIE or the like to leave the silicon oxide film only on the upper and side surfaces of the gate electrode 4, thereby forming the cap insulating film 23 and the side wall protective film 24 to cover the gate electrode 4. At the same time, the gate oxide films 3 between the gate electrodes 4, between the field shield element isolation structures 2, and between each gate electrode 4 and the field shield element isolation structure 2 are removed to expose the surface of the silicon semiconductor substrate 1 at these portion.

An undoped polysilicon film is deposited on the entire surface by CVD and patterned by photolithography and dry etching or the like to remove the polysilicon film on the cap insulating film 23 and the field shield element isolation structure 2. At this time, pad polysilicon films are formed to be electrically connected to the surface of the silicon semiconductor substrate 1 between the gate electrodes 4, between the field shield element isolation structures 2, and between each gate electrode 4 and the field shield element isolation structure 2 and also to be electrically isolated from each other on the cap insulating film 23 or the field shield element isolation structure 2.

Figure 3B:
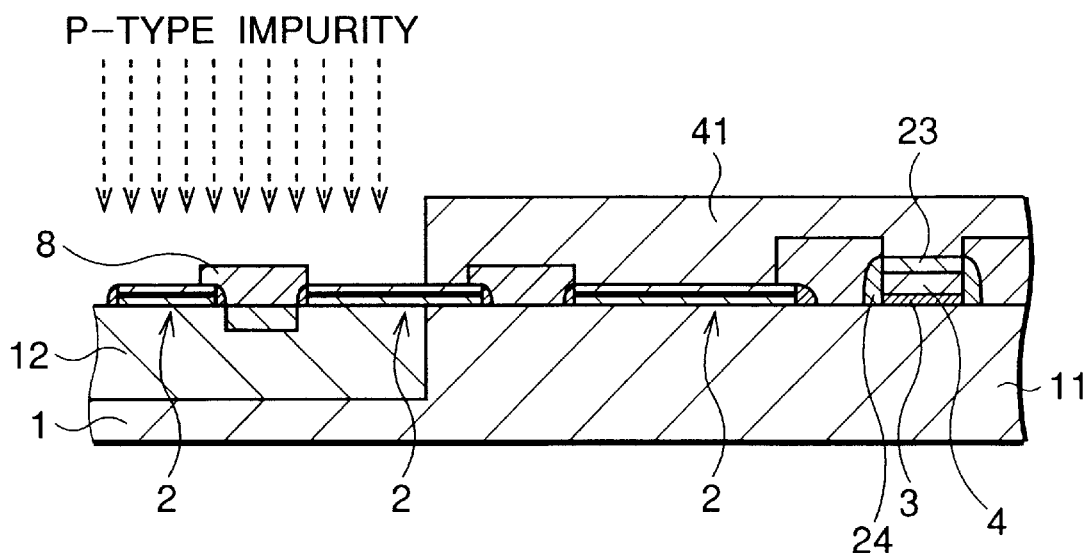

As shown in FIG. 3B, a photoresist is applied to the memory cell region side, i.e., over the p-type well 11 to form a resist mask 41. A p-type impurity such as boron is ion-implanted into the pad polysilicon film on the peripheral circuit region side (the n-type well 12 side) with using the resist mask 41 as a mask, thereby forming the p-type pad polysilicon film 8.

Figure 3C:
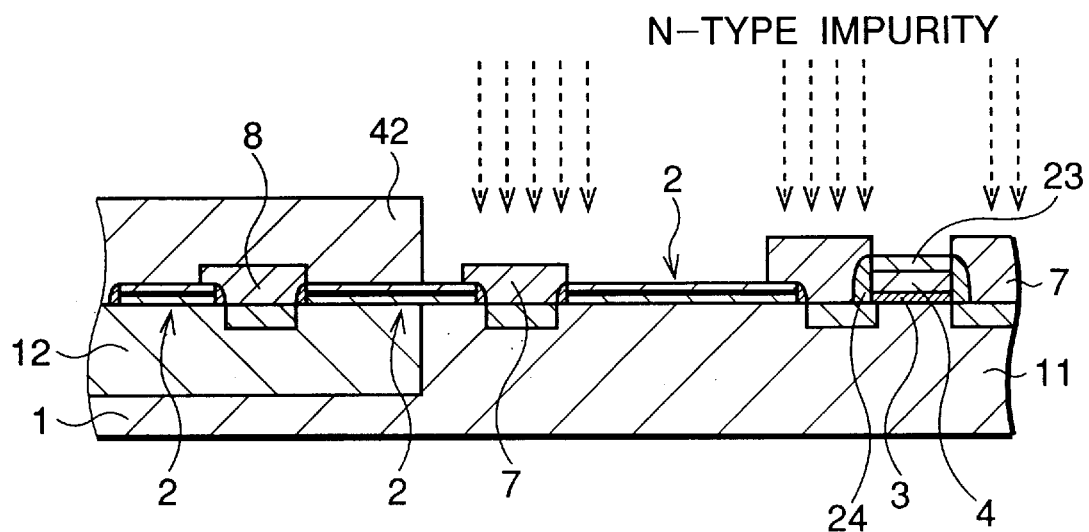

The resist mask 41 is removed by ashing or the like. As shown in FIG. 3C, a photoresist is applied to the peripheral circuit region side, i.e., over the n-type well 12 to form a resist mask 42. An n-type impurity such as phosphorus or arsenic is ion-implanted into the pad polysilicon film on the memory cell region side with using the resist mask 42 as a mask, thereby forming the n-type pad polysilicon film 7.

The resist mask 42 is removed by ashing or the like. Annealing is performed at 900° C. to 950° C. to diffuse the n- and p-type impurities doped in the pad polysilicon films 7 and 8 outward into the surface region of the silicon semiconductor substrate 1, thereby forming the n- and p-type impurity diffusion layers 5 and 6.

Figure 3D:
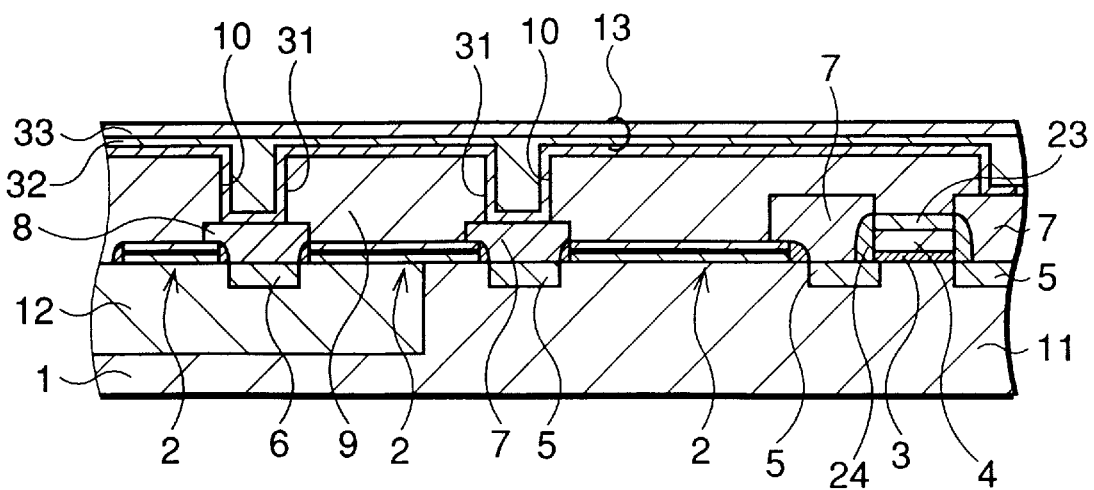

As shown in FIG. 3D, a BPSG film is deposited on the entire surface in the memory cell region and the peripheral circuit region by atmospheric-pressure CVD to form the insulating interlayer 9. The insulating interlayer 9 is reflowed by annealing at a predetermined temperature of 900° C. or more to planarize the surface of the insulating interlayer 9.

The insulating interlayer 9 is subjected to photolithography and dry etching or the like to form the contact holes 10 serving as bit contacts to partially expose the surface of the n-type pad polysilicon film 7 formed on one of the pair of n-type impurity diffusion layers 5 in the memory cell region and the surface of the p-type pad polysilicon film 8 formed on one of the pair of p-type impurity diffusion layers 6 in the peripheral circuit region.

An underlying film consisting of TiSiN or WSiN containing silicon is deposited by sputtering to cover the surface of the insulating interlayer 9 and the inner wall of each contact hole 10.

An n-type (or p-type) polysilicon film is deposited on the underlying film by low-pressure CVD to fill each contact hole 10 with the underlying film intervened. A silicide film of a refractory metal is deposited on the polysilicon film by sputtering.

The resultant silicide film, polysilicon film, and underlying film are patterned into a predetermined shape by photolithography and dry etching or the like. With this process, the diffusion prevention film 31 is patterned from the underlying film, and the polycide wiring layer 13 having a two-layer structure of the silicide film 33 and the polysilicon film 32 is formed on the diffusion prevention film 31.

Figure 3E:
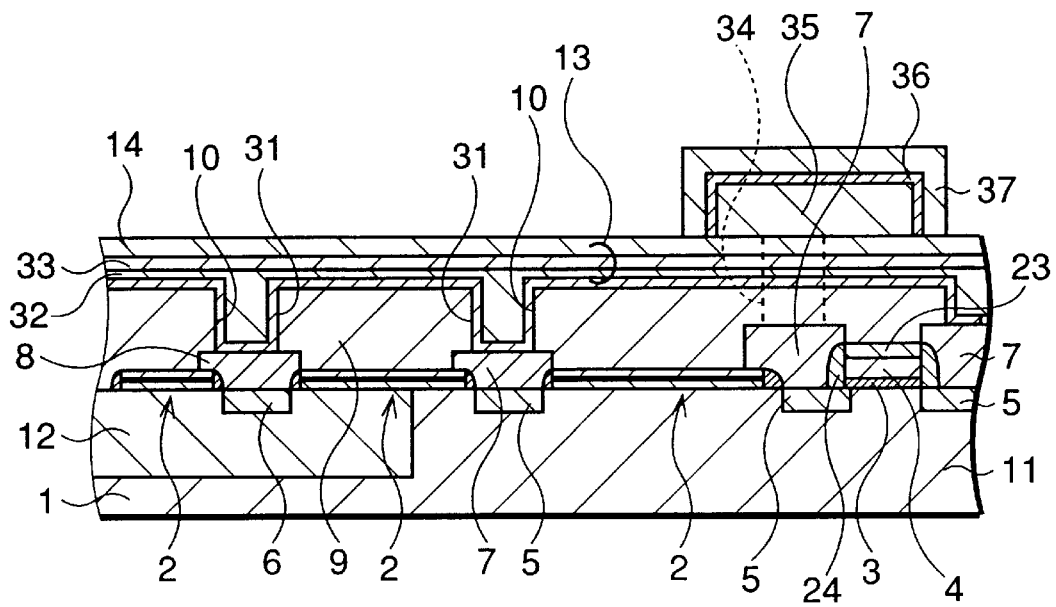

As shown in FIG. 3E, the cap insulating film 14 consisting of, e.g., $SiO_2$ is deposited by CVD or the like to cover the polycide wiring layer 13. A memory capacitor is formed on the cap insulating film 14 in the following manner.

In the memory cell region, the contact hole 34 serving as a storage contact is formed in the cap insulating film 14 and the insulating interlayer 9 by photolithography and dry etching or the like to partially expose the surface of the n-type pad polysilicon film 7 formed on the other of the pair of n-type impurity diffusion layer 5 which is not connected to the polycide wiring layer 13.

A polysilicon film is deposited on the cap insulating film 14 including the inside of the contact hole 34 by CVD or the like. The storage node electrode 35 is patterned into a predetermined shape by photolithography and dry etching or the like.

An ONO composite film is formed to cover the storage node electrode 35 and healing-oxidized. Thereafter, the dielectric film 36 is patterned into a predetermined shape by photolithography and dry etching or the like.

A polysilicon film is deposited by CVD or the like to cover the dielectric film 36 and subjected to photolithography and dry etching or the like to form the cell plate electrode 37 having a predetermined shape, thus completing a memory capacitor having the storage node electrode 35, the dielectric film 36, and the cell plate electrode 37.

Figure 3F:
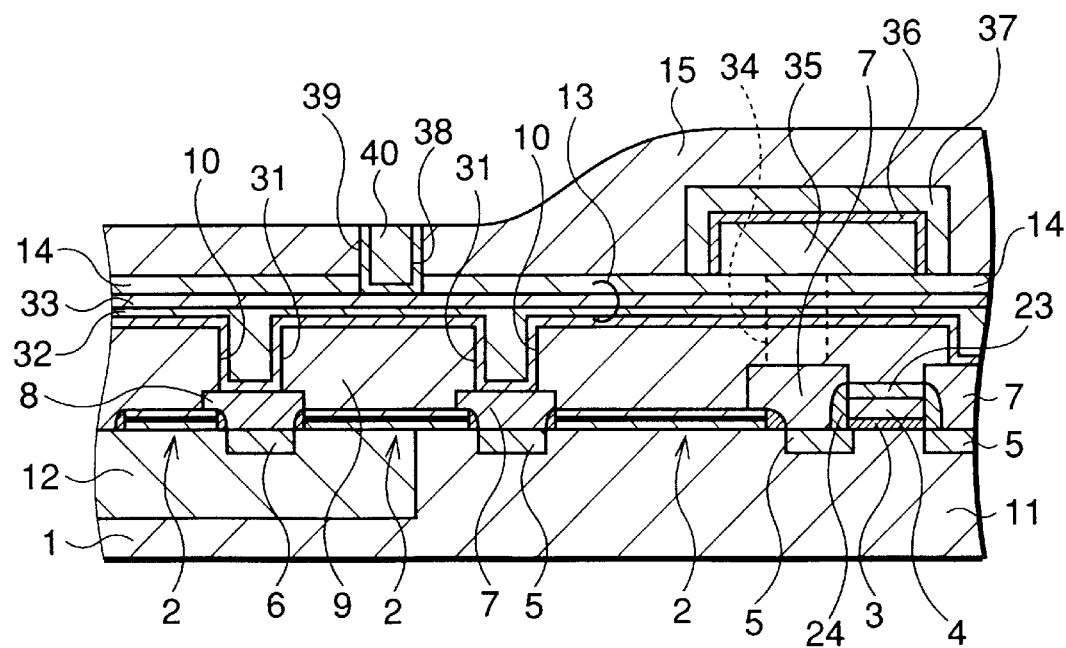

As shown in FIG. 3F, a BPSG film is deposited on the entire surface in the memory cell region and the peripheral circuit region by atmospheric-pressure CVD to cover the memory capacitor, thereby forming the insulating interlayer 15. The insulating interlayer 15 is reflowed by annealing at a predetermined temperature of 900° C. or more to planarize the surface of the insulating interlayer 15.

The contact hole 38 is formed in the insulating interlayer 15 and the cap insulating film 14 by photolithography and dry etching or the like to partially expose the surface of the silicide film 33 of the polycide wiring layer 13.

A TiN film is formed by sputtering to cover the inner wall of the contact hole 38. Next, a tungsten film is formed by low-pressure CVD to fill the contact hole 38 with the TiN film intervened. The tungsten film and the TiN film are etched using a sulfur-fluoride-based etching gas to form the underlying protective film 39 formed from the TiN film left in the contact hole 38, and the W plug 40 filling the contact hole 38 with the underlying protective film 39 intervened.

An aluminum alloy film is deposited on the entire surface of the insulating interlayer 15 including the exposed upper surfaces of the W plug 40 and the underlying protective film 39 by sputtering. The aluminum alloy film is subjected to photolithography and dry etching or the like to pattern the aluminum wiring layer 16 electrically connected to the W plug 40 and the underlying protective film 39.

An insulating interlayer consisting of a BPSG film or the like is formed to cover the aluminum wiring layer 16, thus completing the DRAM.

As described above, in the method of manufacturing the DRAM of the first embodiment, the refractory and conductive diffusion prevention film 31 containing silicon is formed as a diffusion prevention film for preventing interdiffusion of the n- and p-type impurities in the n- and p-type impurity diffusion layers 5 and 6. The polycide wiring layer 13 is electrically connected to the impurity diffusion layers 5 and 6 through the diffusion prevention film 31. The diffusion prevention film 31 has an excellent heat resistance and never suffer peel-off or junction leakage even in high-temperature annealing. Therefore, even when a semiconductor device which requires high-temperature annealing at, e.g., 900° C. or more after formation of the polycide wiring layer 13 and the diffusion prevention film 31, e.g., a DRAM having a COB structure using the polycide wiring layer 13 as a bit line is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

In addition, interdiffusion of the impurities of opposite conductivity types can be prevented by the diffusion prevention film 31 without separating the polycide wiring layer 13 serving as a bit line. The photolithography process of separating the polycide wiring layer 13 can be omitted, and the number of manufacturing processes can be reduced.

Second Embodiment

The second embodiment will be described next. In the second embodiment, a DRAM and a method of manufacturing the DRAM will be exemplified, as in the first embodiment. The DRAM of the second embodiment has almost the same structure as that of the first embodiment, although it is different in the shape of a polycide wiring layer serving as a bit line, the formation position of a diffusion prevention film as an underlying film of the polycide wiring layer, and the like.

Figure 4:
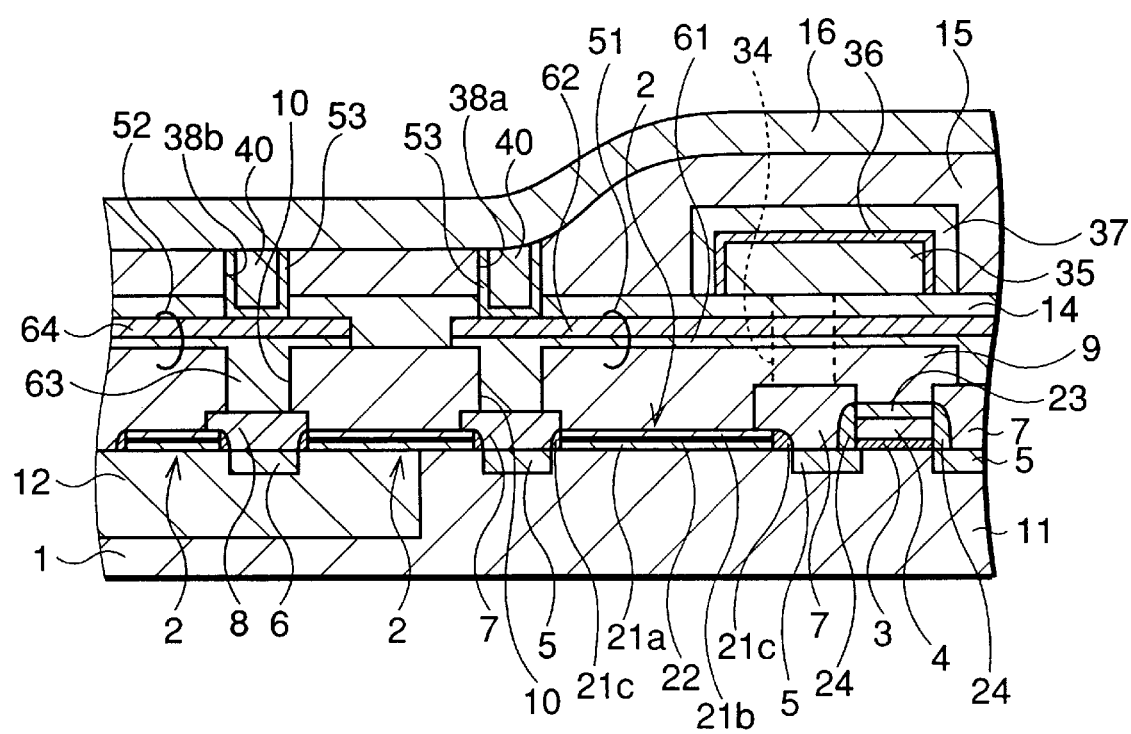
FIG. 4 is a schematic sectional view showing a DRAM according to the second embodiment of the present invention.

FIG. 4 is a schematic sectional view showing the main portion of the memory cell region and part of the peripheral circuit region of the DRAM according to the second embodiment. This DRAM has a COB structure in which a memory capacitor is substantially formed above a bit line in the memory cell region. The same reference numerals as in FIG. 1 denote the same parts in FIG. 4, and a detailed description thereof will be omitted.

In this DRAM, an island-shaped n-type well 12 is formed in a silicon semiconductor substrate 1, and the remaining portion of the silicon semiconductor substrate 1 becomes a p-type well 11, as in the DRAM of the first embodiment. Constituent elements (an access transistor and a memory capacitor) in the memory cell region are formed on the p-type well 11, and constituent elements (a pMOS transistor and the like) in the peripheral circuit region are formed on the n-type well 12.

N- and p-type pad polysilicon films 7 and 8 are patterned. N-type impurity diffusion layers 5 are formed at the connection portions between the silicon semiconductor substrate 1 and the pad polysilicon films 7, and p-type impurity diffusion layers 6 are formed at the connection portions between the silicon semiconductor substrate 1 and the pad polysilicon films 8. Contact holes 10 are formed in an insulating interlayer 9 covering the pad polysilicon films 7 and 8 to partially expose the surface of the n-type pad polysilicon film 7 formed on one of the pair of n-type impurity diffusion layers 5 in the memory cell region and the surface of the p-type pad polysilicon film 8 formed on one of the pair of p-type impurity diffusion layers 6 in the peripheral circuit region.

In the DRAM of the second embodiment, a polycide wiring layer which is formed on the insulating interlayer 9 to fill each contact hole 10 and serves as a bit line is constituted by an n-type polycide wiring layer 51 and a p-type polycide wiring layer 52. The n-type polycide wiring layer 51 is formed in the memory cell region, and the p-type polycide wiring layer 52 is formed in the peripheral circuit region. The n-type polycide wiring layer 51 on the memory cell region side and the p-type polycide wiring layer 52 on the peripheral circuit region side are isolated from each other.

The n-type polycide wiring layer 51 has a two-layer structure in which a silicide film 62 of a refractory metal is stacked on an n-type polysilicon film 61. The n-type polysilicon film 61 fills the contact hole 10 on the memory cell region side and is connected to one of the pair of n-type impurity diffusion layers 5. The p-type polycide wiring layer 52 has a two-layer structure in which a silicide film 64 of a refractory metal is stacked on a p-type polysilicon film 63. The p-type polysilicon film 63 fills the contact hole 10 on the peripheral circuit region side and is connected to one of the pair of p-type impurity diffusion layers 6. The n-type polycide wiring layer 51 and the p-type polycide wiring layer 52 are isolated from each other on the insulating interlayer 9.

A cap insulating film 14 is deposited to cover the n- and p-type polycide wiring layers 51 and 52. In the memory cell region, a contact hole 34 serving as a storage contact is formed in the cap insulating film 14 and the insulating interlayer 9 to partially expose the surface of the n-type pad polysilicon film 7 formed on the other of the pair of n-type impurity diffusion layers 5 which is not connected to the n-type polycide wiring layer 51. As in the first embodiment, the memory capacitor in the memory cell region is formed on the cap insulating film 14.

An insulating interlayer 15 consisting of a BPSG film is deposited on the memory capacitor and the cap insulating film 14 to cover the memory capacitor. Contact holes 38a and 38b are formed in the insulating interlayer 15 and the cap insulating film 14 to partially expose the surfaces of the silicide films 62 and 64 of the n- and p-type polycide wiring layers 51 and 52, respectively.

A refractory and conductive diffusion prevention film 53 as an underlying film is formed on the inner wall (i.e., the side wall corresponding to the exposed surface of the insulating interlayer 15 and the bottom surface corresponding to the exposed surface of the silicide film 62 or 64) of each of the contact holes 38a and 38b. In addition, a tungsten plug (W plug) 40 is formed to fill each of the contact holes 38a and 38b with the diffusion prevention film 53 intervened.

The diffusion prevention film 53 is an underlying film consisting of TiSiN or WSiN containing silicon. The diffusion prevention film 53 prevents interdiffusion of the n-type impurity in the n-type impurity diffusion layers 5 (and the n-type pad polysilicon films 7 connected to the n-type impurity diffusion layers 5) in the memory cell region and the p-type impurity in the p-type impurity diffusion layers 6 (and the pad polysilicon films 8 connected to the p-type impurity diffusion layers 6) in the peripheral circuit region when the n- and p-type polycide wiring layers 51 and 52 are electrically connected through an aluminum wiring layer 16 (to be described later).

The aluminum wiring layer 16 consisting of, e.g., an aluminum alloy is patterned on the entire surface of the insulating interlayer 15 including the exposed upper surface of the W plug 40. The aluminum wiring layer 16 is electrically connected to the n- and p-type polycide wiring layers 51 and 52 through the W plugs 40 and the diffusion prevention films 53.

An insulating interlayer consisting of a BPSG film or the like is formed to cover the aluminum wiring layer 16, thus constituting a DRAM.

As described above, in the DRAM of the second embodiment, the refractory and conductive diffusion prevention film 53 containing silicon is formed as a diffusion prevention film for preventing interdiffusion of the n- and p-type impurities in the n- and p-type impurity diffusion layers 5 and 6. The n- and p-type polycide wiring layers 51 and 52 connected to the impurity diffusion layers 5 and 6 are electrically connected to the aluminum wiring layer 16 through the diffusion prevention films 53. The diffusion prevention film 53 has an excellent heat resistance and never suffers peel-off or junction leakage even in high-temperature annealing. Therefore, even when a semiconductor device which requires high-temperature annealing after formation of the n- and p-type polycide wiring layers 51 and 52 and the diffusion prevention film 53, e.g., a DRAM having a COB structure using the n- and p-type polycide wiring layers 51 and 52 (and the diffusion prevention film 53) as bit lines is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

The method of manufacturing the DRAM of the second embodiment will be described next. FIGS. 5A to 5G are schematic sectional views showing steps in manufacturing the DRAM. The same reference numerals as in FIG. 4 denote the same parts in FIGS. 5A to 5G.

Figure 5A:
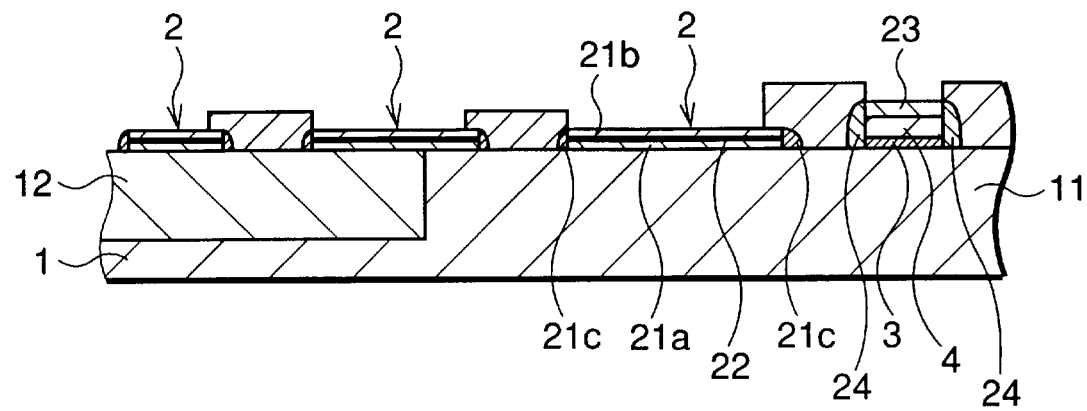
FIGS. 5A to 5G are schematic sectional views showing steps in manufacturing the DRAM according to the second embodiment of the present invention.

As shown in FIG. 5A, an n-type impurity is doped into the surface region of the p-type silicon semiconductor substrate 1 to form the n-type well 12 having an island shape. The region of the silicon semiconductor substrate 1 outside the n-type well 12 becomes the p-type well 11. Subsequently, the field shield element isolation structure 2 is formed on the surface of the silicon semiconductor substrate 1 to demarcate the element active regions in the memory cell region and the peripheral circuit region. The gate oxide film 3, the gate electrode 4, and the cap insulating film 23 and the side wall protective film 24 surrounding the gate electrode 4 are formed.

An undoped polysilicon film is deposited on the entire surface by CVD and patterned by photolithography and dry etching or the like to remove the polysilicon film on the cap insulating film 23 and the field shield element isolation structure 2. At this time, pad polysilicon films are formed to be electrically connected to the surface of the silicon semiconductor substrate 1 between the gate electrodes 4, between the field shield element isolation structures 2, and between each gate electrode 4 and the field shield element isolation structure 2 and also to be electrically isolated from each other on the cap insulating film 23 or the field shield element isolation structure 2.

Figure 5B:
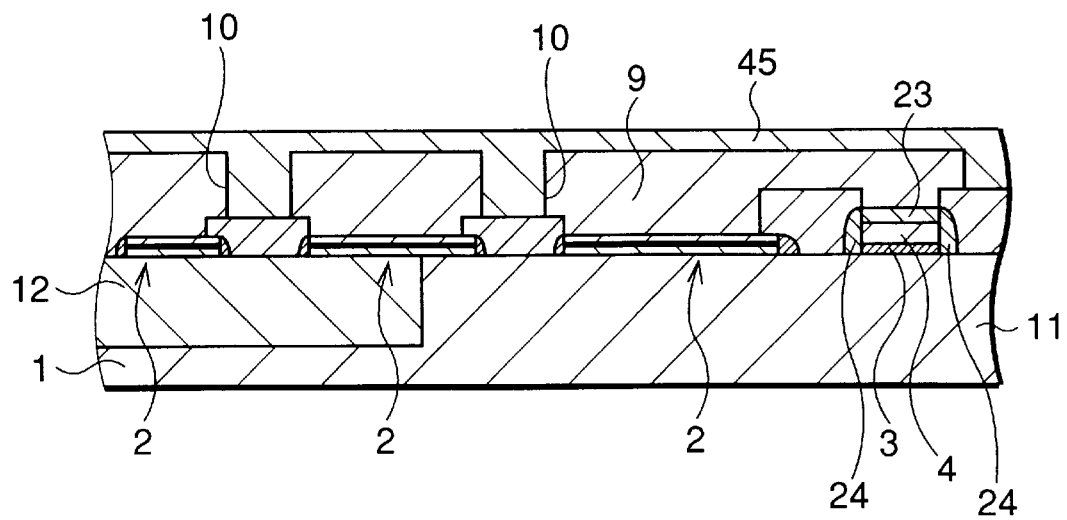

As shown in FIG. 5B, a BPSG film is deposited on the entire surface in the memory cell region and the peripheral circuit region by atmospheric-pressure CVD to form the insulating interlayer 9. The insulating interlayer 9 is reflowed by annealing at a predetermined temperature of 900° C. or more to planarize the surface of the insulating interlayer 9.

The insulating interlayer 9 is subjected to photolithography and dry etching or the like to form the contact holes 10 serving as bit contacts to partially expose the surface of predetermined pad polysilicon films formed in the memory cell region and the peripheral circuit region.

An undoped polysilicon film 45 is deposited on the insulating interlayer 9 by low-pressure CVD to fill the contact holes 10.

Figure 5C:
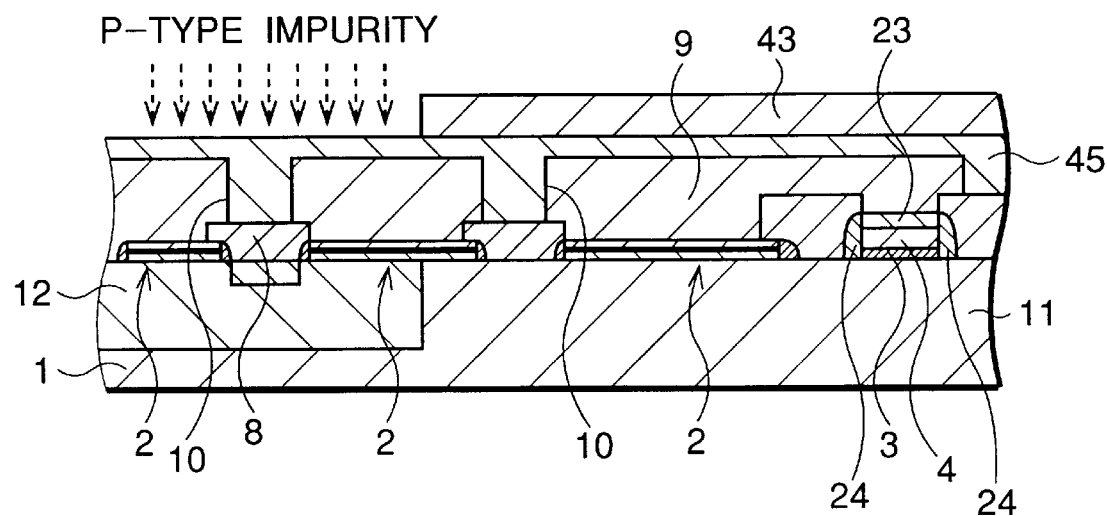

As shown in FIG. 5C, a photoresist is applied to the undoped polysilicon film 45 on the memory cell region side, i.e., over the p-type well 11 to form a resist mask 43. A p-type impurity such as boron is ion-implanted into the undoped polysilicon film 45 on the peripheral circuit region side using the resist mask 43 as a mask. At this time, a p-type region is formed in the polysilicon film 45, and simultaneously, the p-type pad polysilicon film 8 is formed.

Figure 5D:
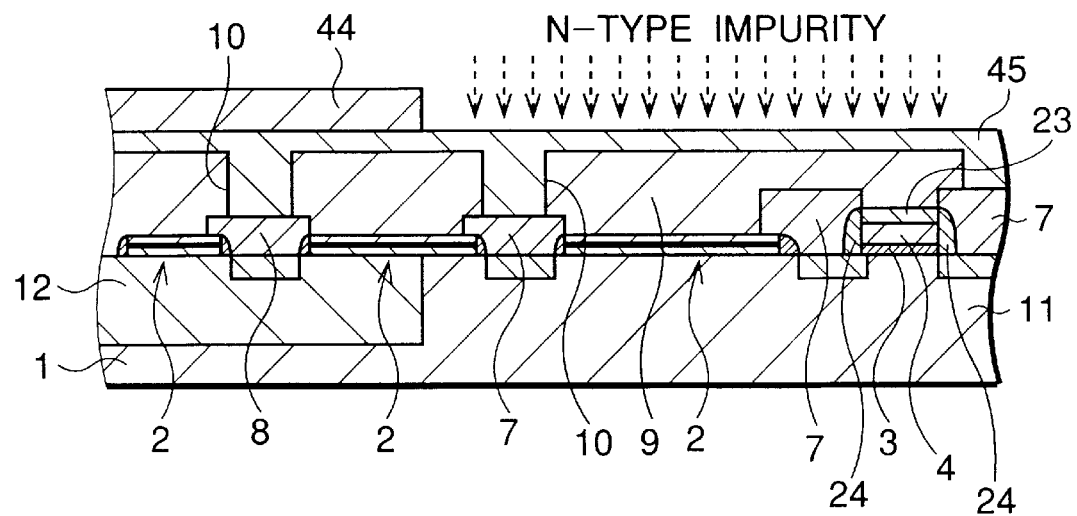

The resist mask 43 is removed by ashing or the like. As shown in FIG. 5D, a photoresist is applied to the undoped polysilicon film 45 on the peripheral circuit region side, i.e., over the n-type well 12 to form a resist mask 44. An n-type impurity such as phosphorus or arsenic is ion-implanted into the undoped polysilicon film on the memory cell region side with the resist mask 44 as a mask. At this time, an n-type region is formed in the polysilicon film 45, and simultaneously, the n-type pad polysilicon film 7 is formed.

The resist mask 44 is removed by ashing or the like. Annealing is performed at 900° C. to 950° C. to diffuse the n- and p-type impurities doped in the pad polysilicon films 7 and 8 outward into the surface region of the silicon semiconductor substrate 1, thereby forming the n- and p-type impurity diffusion layers 5 and 6. With this process, an access transistor as an nMOS transistor is formed in the element active region in the memory cell region, and a pMOS transistor is formed in the element active region in the peripheral circuit region.

Figure 5E:
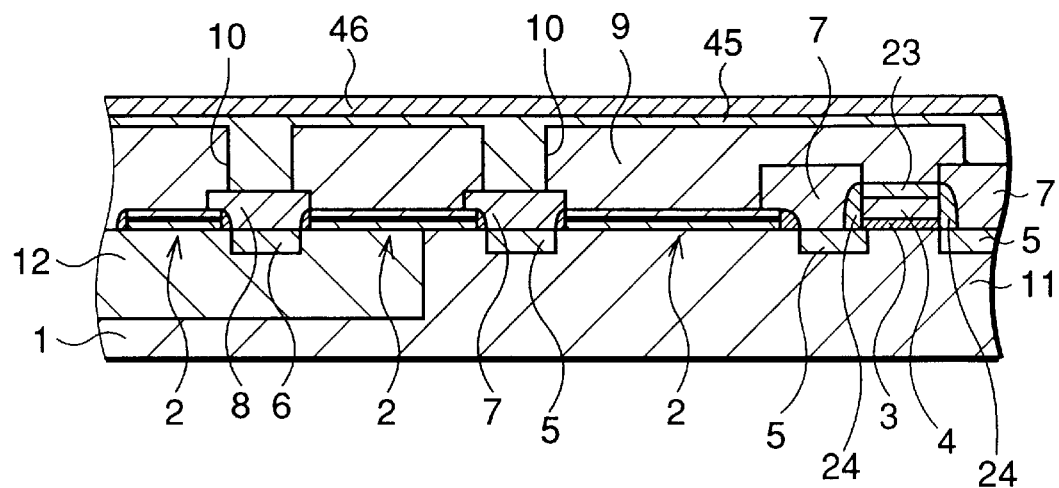

As shown in FIG. 5E, a silicide film 46 of a refractory metal is deposited by sputtering on the polysilicon film 45 which has undergone ion implantation as described above.

Figure 5F:
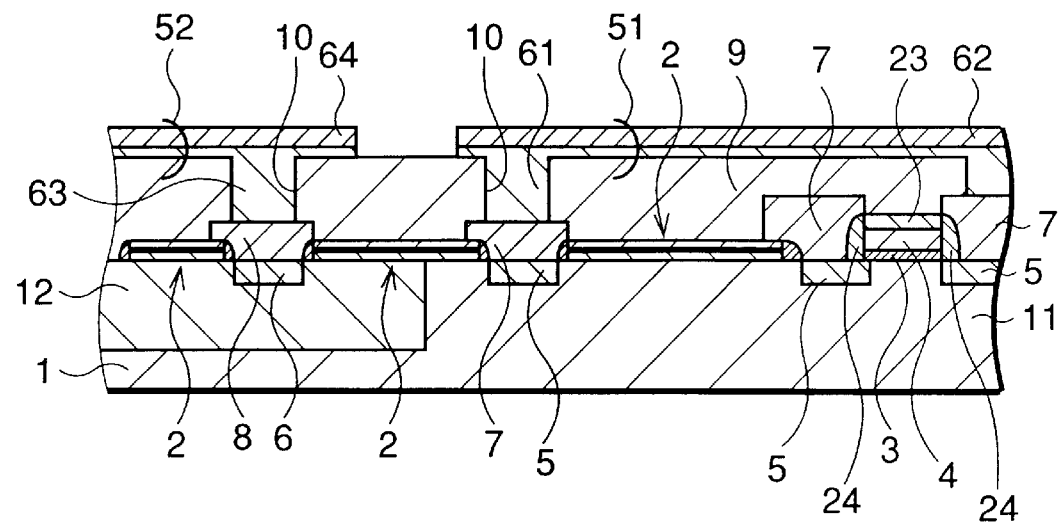

As shown in FIG. 5F, the silicide film 46 and the polysilicon film 45 are subjected to photolithography and dry etching or the like to isolate these films on the n-type impurity doped side and the p-type impurity doped side, thereby patterning the n-type polycide wiring layer 51 formed from the polysilicon film 61 and the silicide film 62, and the p-type polycide wiring layer 52 formed from the polysilicon film 63 and the silicide film 64.

Figure 5G:
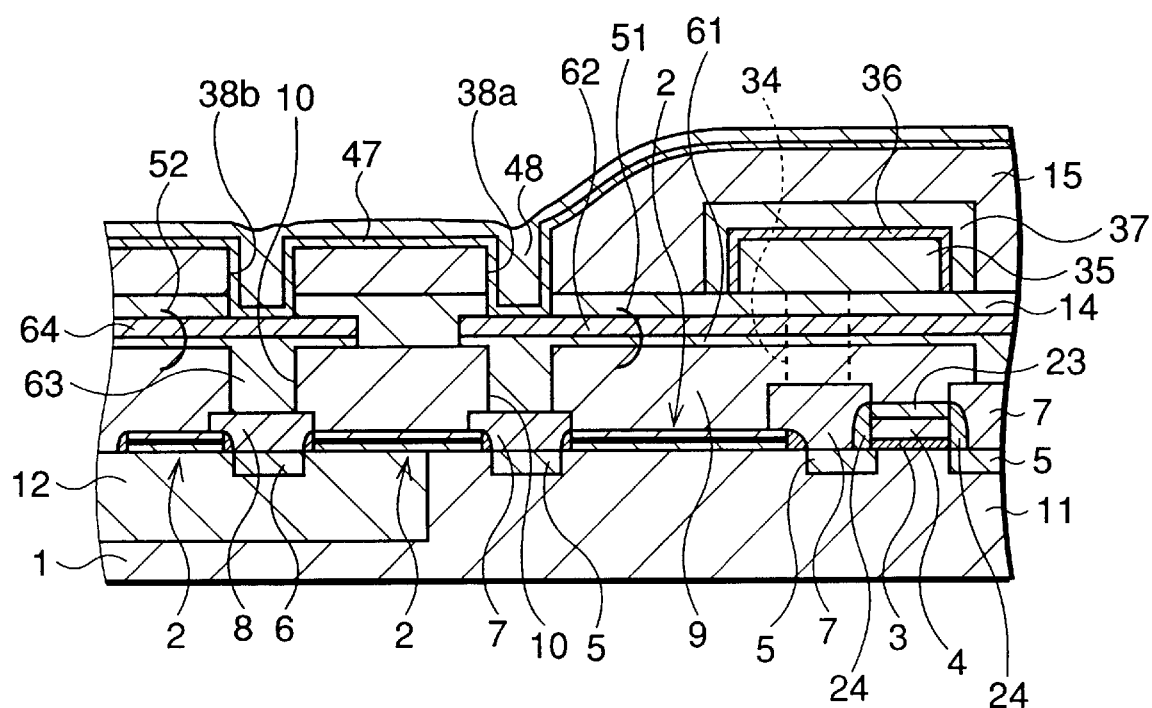

As shown in FIG. 5G, the cap insulating film 14 consisting of, e.g., $SiO_2$ is deposited by CVD or the like to cover the n- and p-type polycide wiring layers 51 and 52. A memory capacitor having a storage node electrode 35 filling the contact hole 34, a dielectric film 36, and a cell plate electrode 37 is patterned on the cap insulating film 14.

A BPSG film is deposited on the entire surface in the memory cell region and the peripheral circuit region by atmospheric-pressure CVD to cover the memory capacitor, thereby forming the insulating interlayer 15. The insulating interlayer 15 is reflowed by annealing at a predetermined temperature of 900° C. or more to planarize the surface of the insulating interlayer 15.

The contact holes 38a and 38b are formed in the insulating interlayer 15 and the cap insulating film 14 by photolithography and dry etching or the like to partially expose the surfaces of the silicide films 62 and 64 of the n- and p-type polycide wiring layers 51 and 52, respectively.

An underlying film 47 consisting of TiN or WSiN containing silicon is formed by sputtering to cover the inner wall (i.e., the side wall corresponding to the exposed surface of the insulating interlayer 15 and the bottom surface corresponding to the exposed surface of the silicide film 62 or 64) of each of the contact holes 38a and 38b. Subsequently, a tungsten film 48 is formed by low-pressure CVD to fill each of the contact holes 38a and 38b with the underlying film 47 intervened.

The tungsten film 48 and the underlying film 47 are etched using a sulfur-fluoride-based etching gas to form the diffusion prevention film 53 formed from the underlying film 47 left in each of the contact holes 38a and 38b, and the W plug 40 filling each of the contact holes 38a and 38b with the diffusion prevention film 53 intervened.

An aluminum alloy film is deposited on the entire surface of the insulating interlayer 15 including the exposed upper surfaces of the W plug 40 and the diffusion prevention film 53 by sputtering. The aluminum alloy film is subjected to photolithography and dry etching or the like to pattern the aluminum wiring layer 16 electrically connected to the W plug 40 and the diffusion prevention film 53.

An insulating interlayer consisting of a BPSG film is formed to cover the aluminum wiring layer 16, and various wiring and the like are formed, thus completing the DRAM.

As described above, in the method of manufacturing the DRAM of the second embodiment, the refractory and conductive diffusion prevention film 53 containing silicon is formed as a diffusion prevention film for preventing inter-diffusion of the n- and p-type impurities in the n- and p-type impurity diffusion layers 5 and 6. The n- and p-type polycide wiring layers 51 and 52 connected to the impurity diffusion layers 5 and 6 are electrically connected to the aluminum wiring layer 116 through the diffusion prevention films 53. The diffusion prevention film 53 has an excellent heat resistance and never suffer peel-off or junction leakage even in high-temperature annealing. Therefore, even when a semiconductor device which requires high-temperature annealing at, e.g., 900° C. or more after formation of the n- and p-type polycide wiring layers 51 and 52 and the diffusion prevention film 53, e.g., a DRAM having a COB structure using the n- and p-type polycide wiring layers 51 and 52 (and the diffusion prevention film 53) as bit lines is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

Third Embodiment

Figure 6:
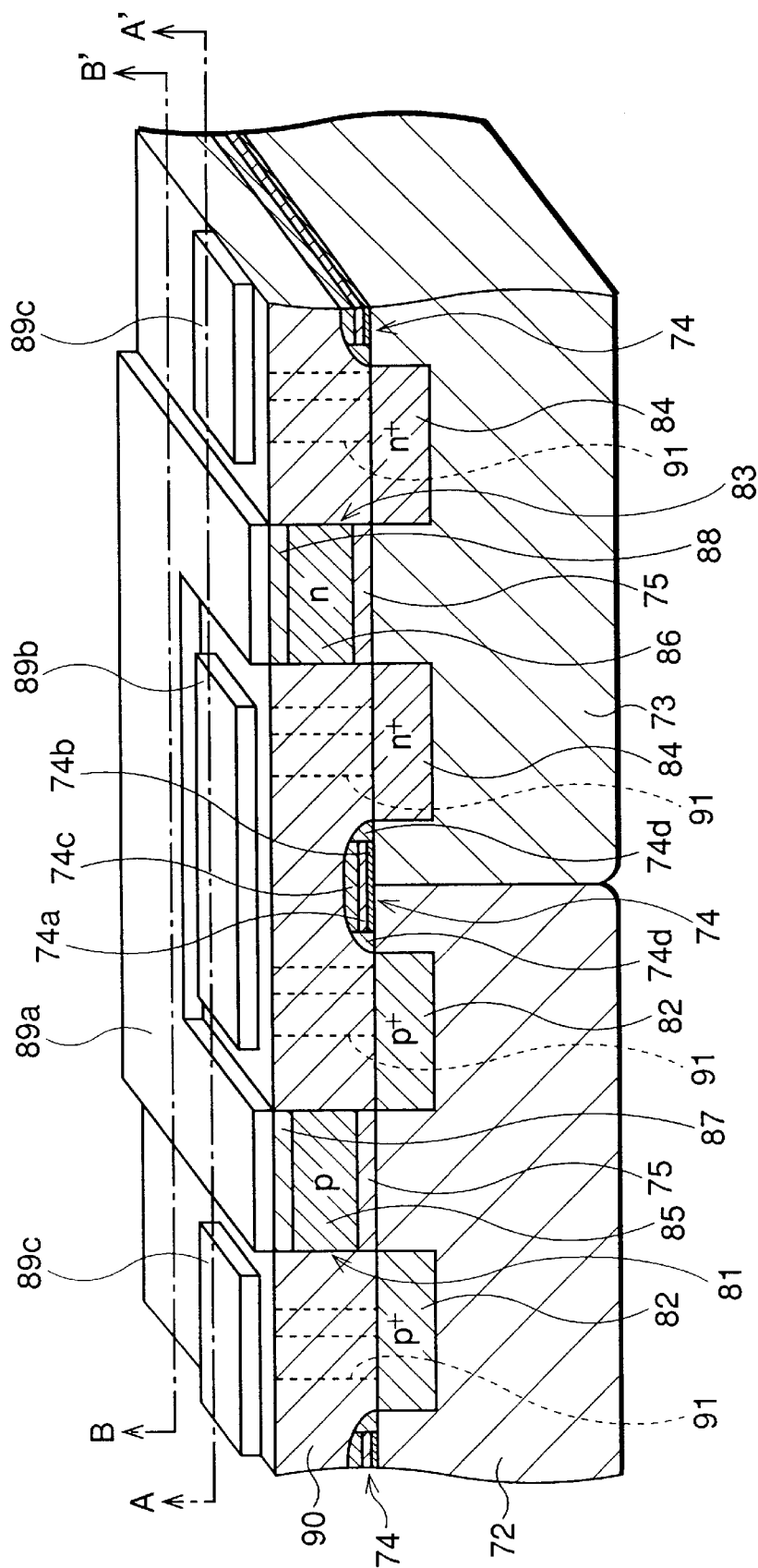
FIG. 6 is a schematic perspective view showing a CMOS inverter according to the third embodiment of the present invention.
Figure 7A:
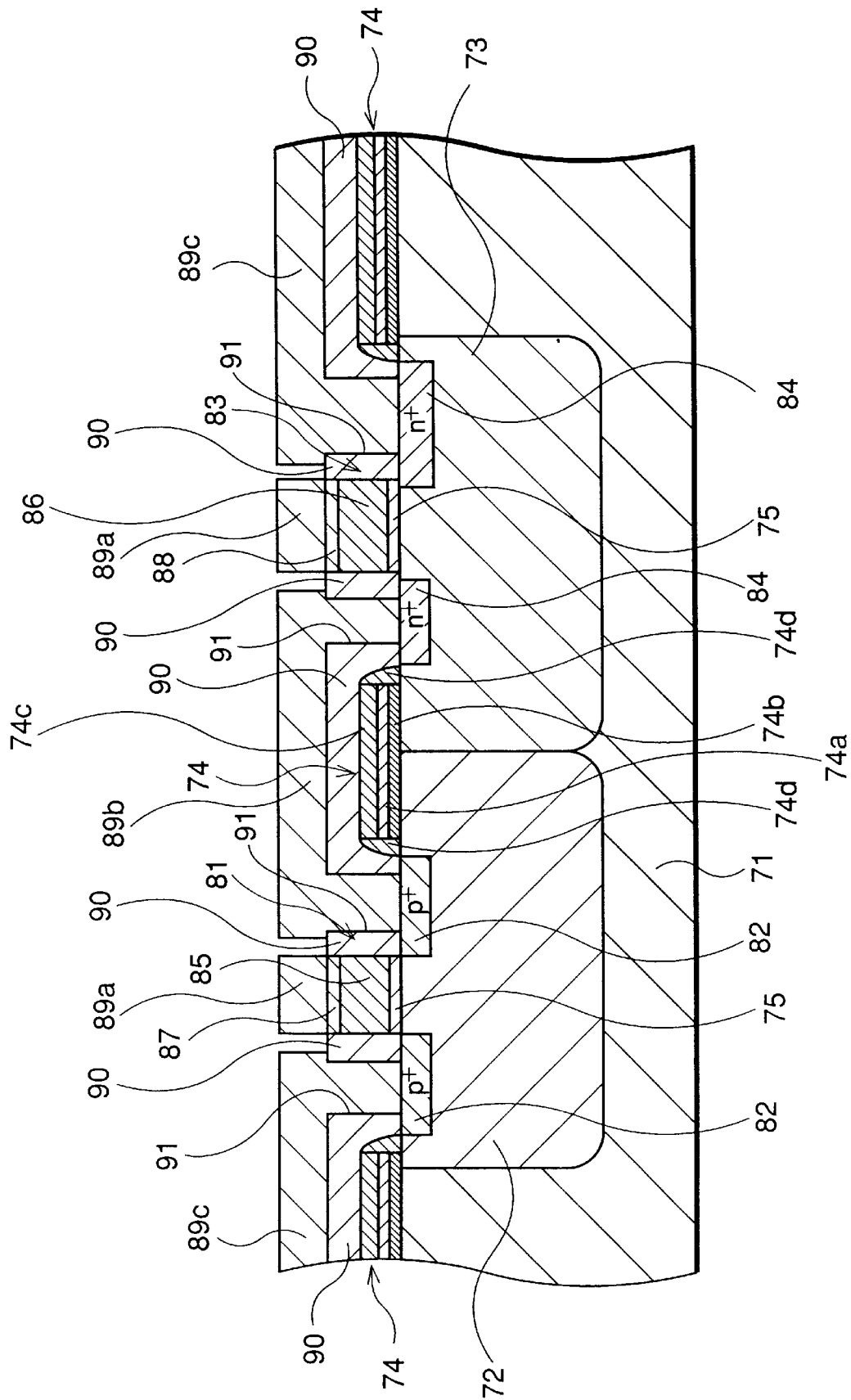
FIGS. 7A and 7B are schematic sectional views showing the CMOS inverter according to the third embodiment of the present invention.
Figure 7B:
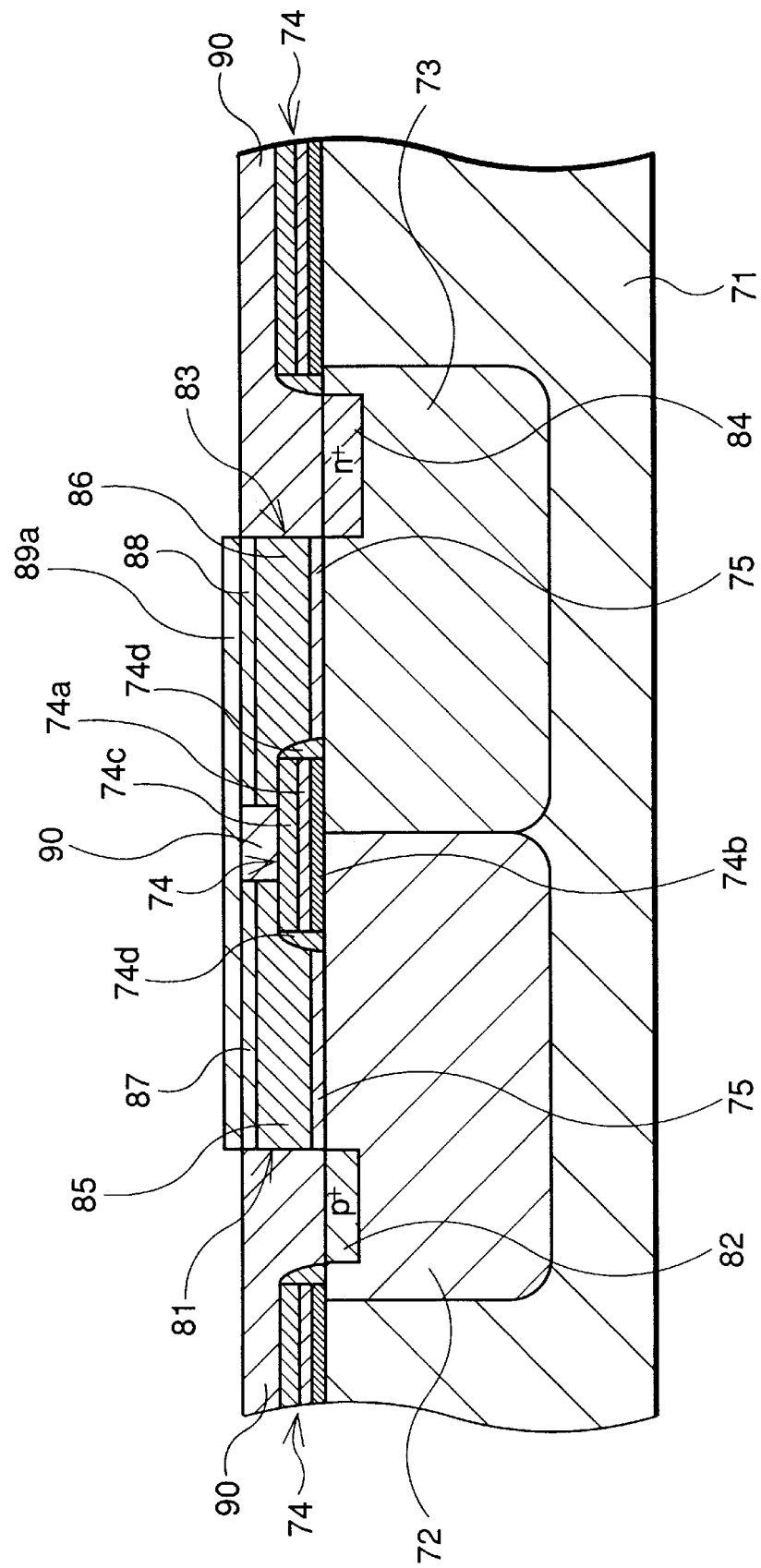

The third embodiment will be described next. In the third embodiment, a so-called dual-gate CMOS inverter and a method of manufacturing the CMOS inverter will be exemplified. FIG. 6 is a schematic perspective view of a CMOS inverter according to the third embodiment. FIG. 7A is a schematic sectional view taken along an alternate long and short dashed line A–A' in FIG. 6. FIG. 7B is a schematic sectional view taken along an alternate long and short dashed line B–B' in FIG. 6.

This CMOS inverter is constituted by forming n- and p-type wells 72 and 73 in a silicon semiconductor substrate 71, demarcating element active regions by a field shield element isolation structure 74, and forming a pMOS transistor and an nMOS transistor in the element active regions on the n-type well 72 and the p-type well 73, respectively. The field shield element isolation structure 74 is formed by patterning a shield plate electrode 74a and a cap insulating film 74c on a shield gate oxide film 74b and forming a side wall protective film 74d on the side surfaces of the shield gate oxide film 74b, the shield plate electrode 74a, and the cap insulating film 74c to bury the shield plate electrode 74a in the silicon oxide film, like the field shield element isolation structure 2 of the DRAM exemplified in the first embodiment.

The pMOS transistor comprises a p-type polycide layer 81 patterned on the n-type well 72 of the silicon semiconductor substrate 1 with a gate oxide film 75 intervened therebetween, and a pair of p-type impurity diffusion layers 82 formed by doping a p-type impurity into the surface region of the silicon semiconductor substrate 71 on both sides of the p-type polycide layer 81. The p-type polycide layer 81 is formed by stacking a p-type gate electrode 85 and a silicide film 87 of a refractory metal such as WSi and patterning these films into a gate electrode shape.

The nMOS transistor comprises an n-type polycide layer 83 patterned on the p-type well 73 of the silicon semiconductor substrate 71 with the gate oxide film 75 intervened therebetween, and a pair of n-type impurity diffusion layers 84 formed by doping an n-type impurity into the surface region of the silicon semiconductor substrate 71 on both sides of the n-type polycide layer 83. The n-type polycide layer 83 is formed by stacking an n-type gate electrode 86 and a silicide film 88 of a refractory metal such as WSi and patterning these films into a gate electrode shape.

The p-type gate electrode 85 is formed by doping a p-type impurity into an undoped polysilicon film. The n-type gate electrode 86 is formed by doping an n-type impurity into an undoped polysilicon film. The p- and n-type polycide layers 81 and 83 respectively including the p- and n-type gate electrodes 85 and 86 are arranged to oppose each other on the field shield element isolation structure 74, as shown in FIG. 7B, such that one end portion of the p-type polycide layer 81 is close to one end portion of the n-type polycide layer 83.

An insulating interlayer 90 consisting of a BPSG film or the like is formed to cover the side portions of the field shield element isolation structure 74 and the p- and n-type polycide layers 81 and 83. The surfaces of the silicide films 87 and 88 of the p- and n-type polycide layers 81 and 83 are substantially flush with the surface of the insulating interlayer 90. Contact holes 91 are formed in the insulating interlayer 90 to partially expose the surfaces of the p- and n-type impurity diffusion layers 82 and 84.

Refractory and conductive diffusion prevention films 89a, 89b, and 89c consisting of TiSiN or WSiN containing silicon are formed on the exposed silicide films 87 and 88 and the contact holes 91, respectively. The diffusion prevention film 89a is formed into an almost C shape to electrically connect the silicide films 87 and 88. The p-type polycide layer 81 and the n-type polycide layer 83 are electrically connected by the diffusion prevention film 89a. The diffusion prevention film 89b is formed such that the p- and n-type impurity diffusion layers 82 and 84 adjacent to each other are electrically connected through the contact holes 91 to serve as drains with the field shield element isolation structure 74 interposed therebetween. The diffusion prevention film 89c is formed such that the p- and n-type impurity diffusion layers 82 and 84 are electrically connected through the contact holes 91 to serve as sources.

An insulating interlayer consisting of a BPSG film is formed to cover the diffusion prevention films 89a to 89c. Contact holes and various wiring layers (none are shown) are formed, thus constituting a CMOS inverter.

As described above, in the CMOS inverter of the third embodiment, the refractory and conductive diffusion prevention films 89b and 89c containing silicon are formed as diffusion prevention films for preventing interdiffusion of the p- and n-type impurities in the p- and n-type impurity diffusion layers 82 and 84. The p-type polycide layer 81 and the n-type polycide layer 83 are electrically connected through the diffusion prevention film 89a. The diffusion prevention films 89a to 89c have an excellent heat resistance and never suffer peel-off or junction leakage even in high-temperature annealing. Therefore, even when a semiconductor device which requires high-temperature annealing after formation of the polycide layer and the diffusion prevention films 89a to 89c, e.g., a dual-gate CMOS inverter having gate electrodes formed from polycide layers of opposite conductivity types is to be formed as in this embodiment, disadvantages due to high-temperature annealing can be prevented, including non-ohmic contact between the impurity diffusion layers 82 and 84 of opposite conductivity types, destruction of barrier properties of the diffusion prevention film, and an increase in resistance.

Figure 8B:
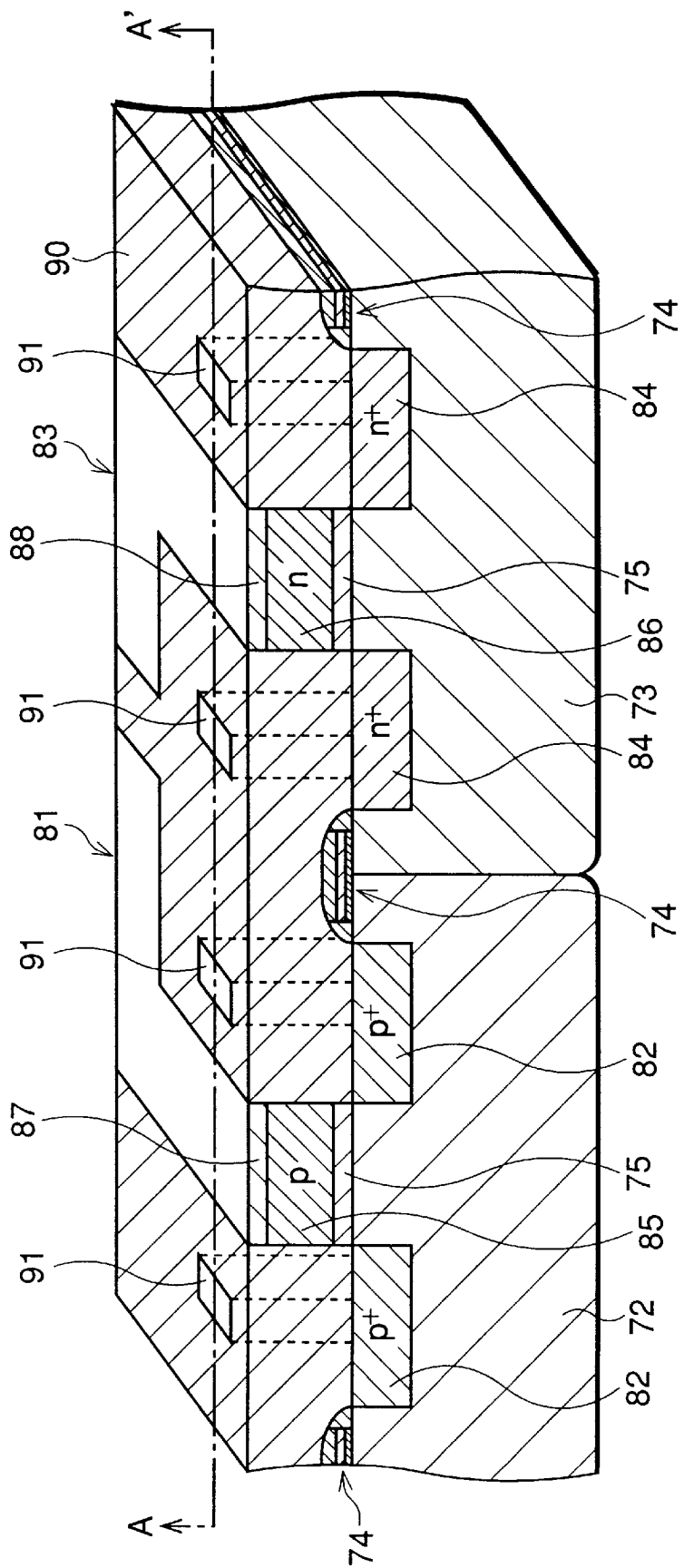
Figure 8C:
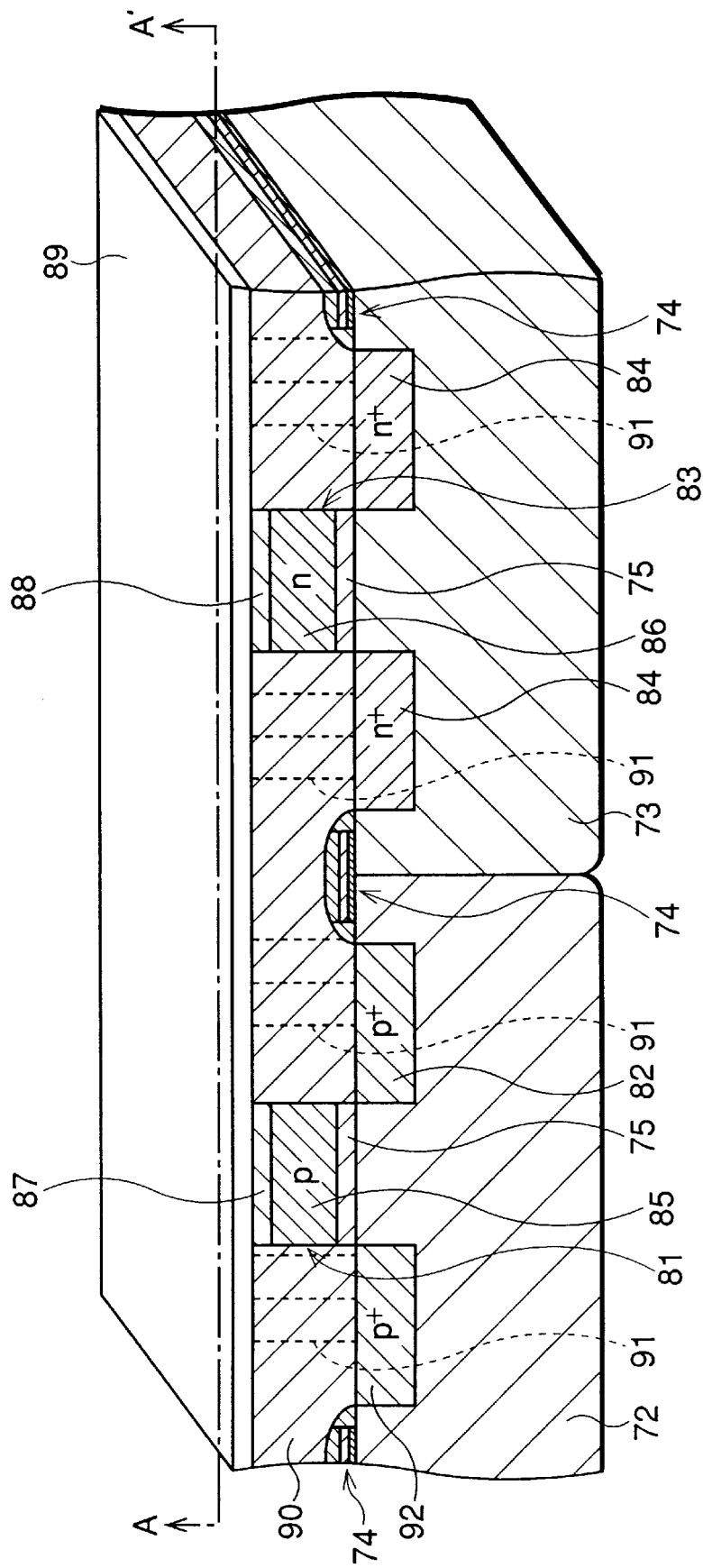
Figure 8D:
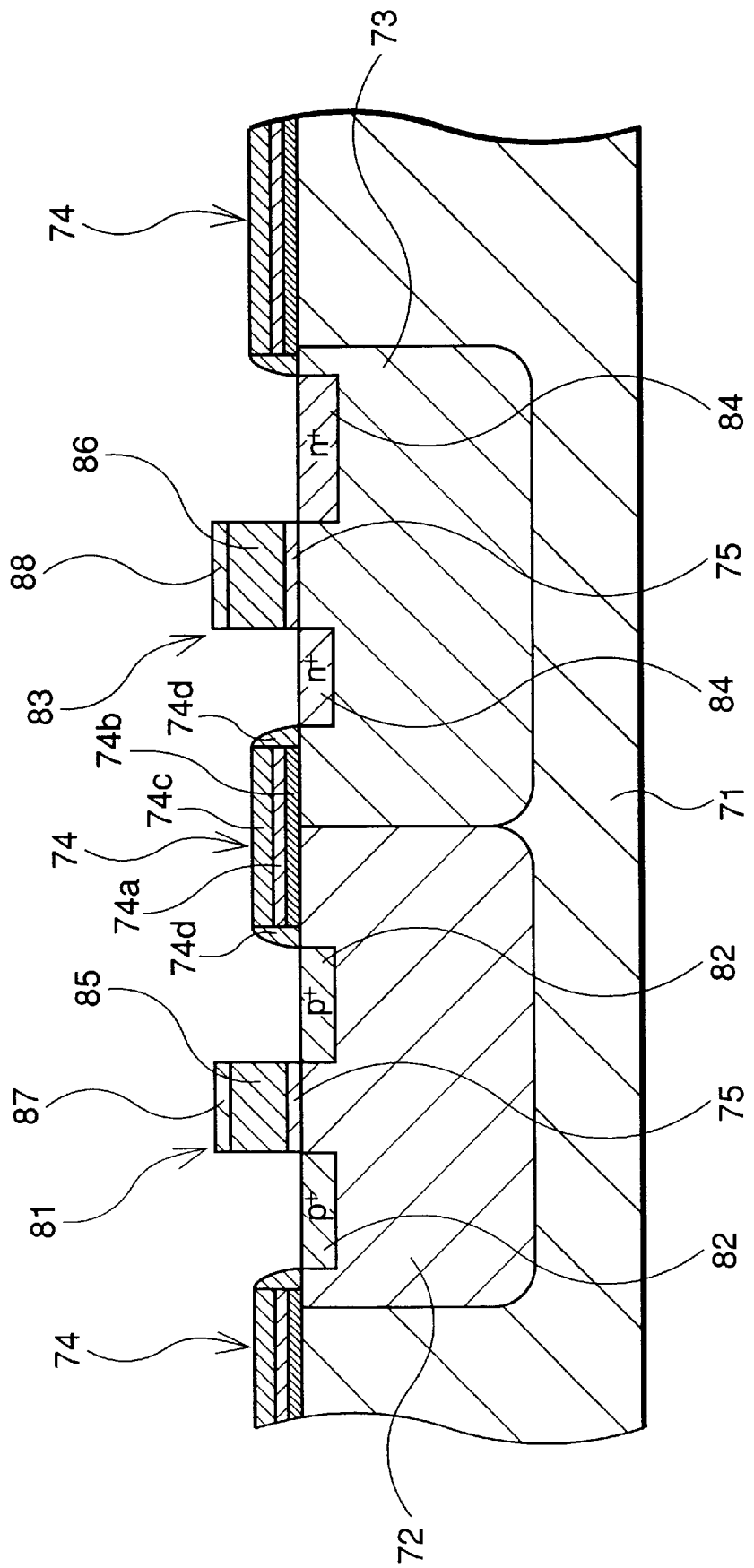
Figure 8E:
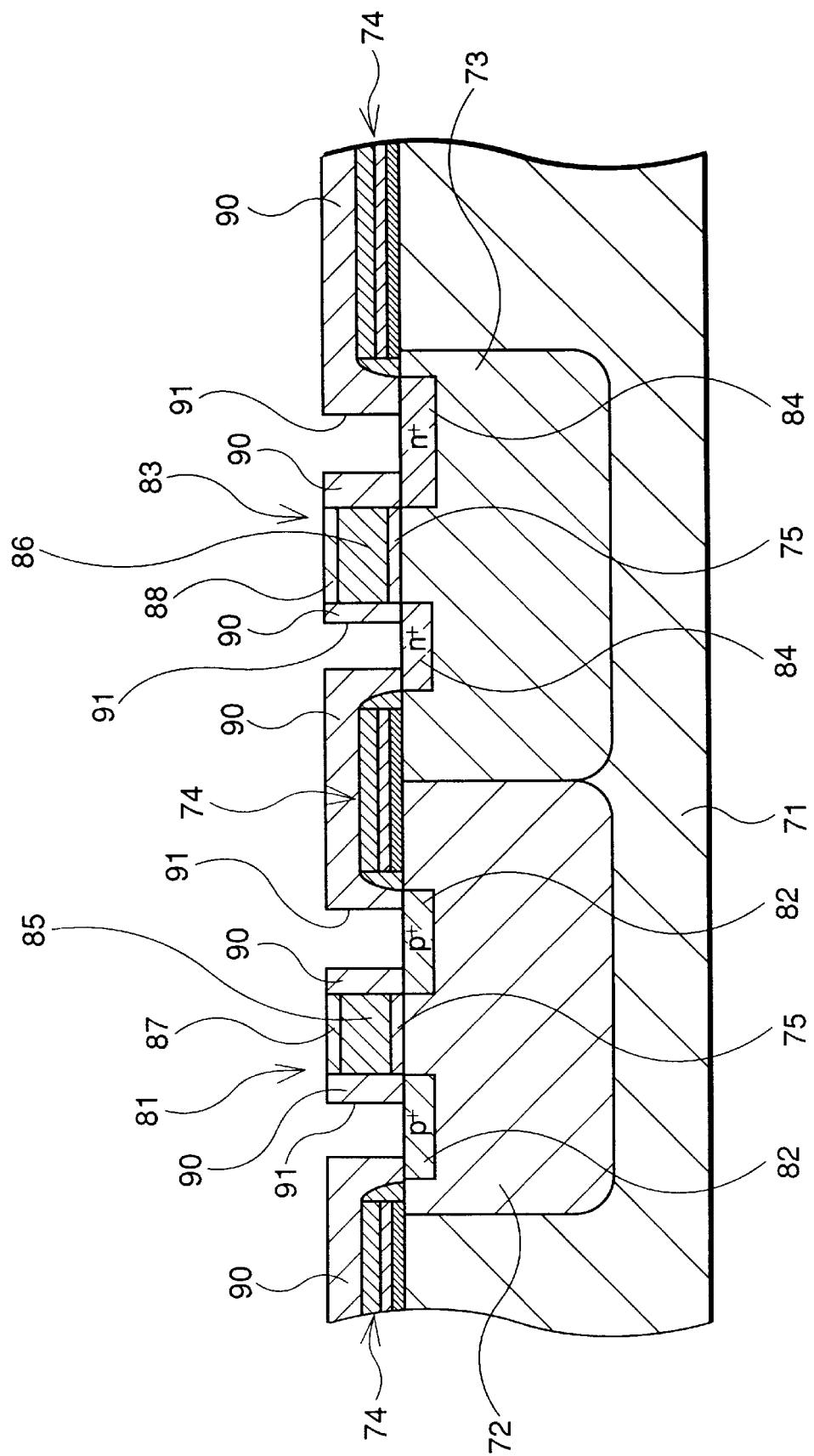
Figure 8F:
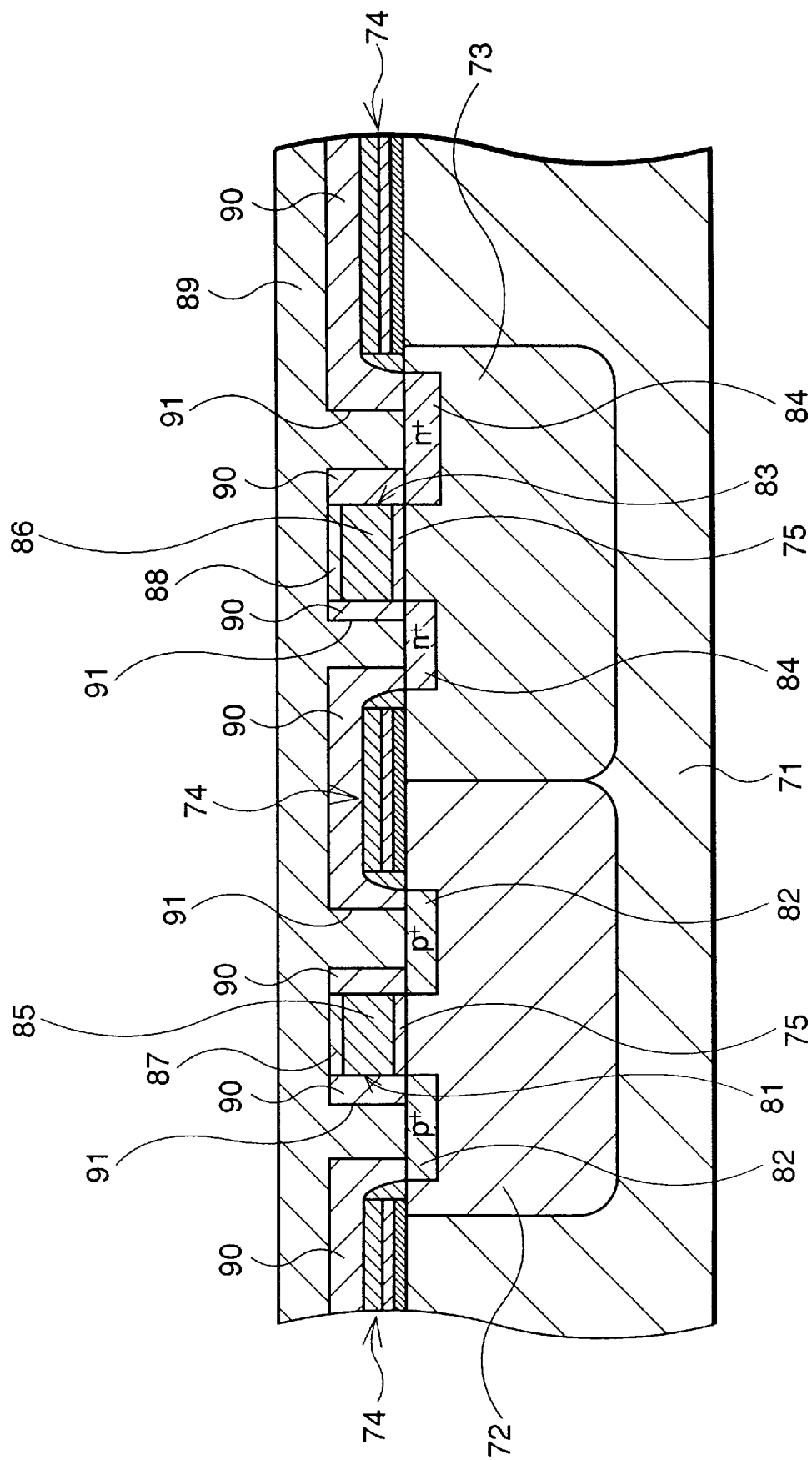

The method of manufacturing the CMOS inverter of the third embodiment will be described next. FIGS. 8A to 8C are schematic perspective views showing steps in manufacturing the CMOS inverter. FIG. 8D is a schematic sectional view taken along an alternate long and short dashed line A–A' in FIG. 8A. FIG. 8E is a schematic sectional view taken along an alternate long and short dashed line A–A' in FIG. 8B. FIG. 8F is a schematic sectional view taken along an alternate long and short dashed line A–A' in FIG. 8C.

As shown in FIGS. 8A and 8D, n- and p-type impurities are sequentially doped into the surface region of the silicon semiconductor substrate 71 to form the n- and p-type wells 72 and 73. The field shield element isolation structure 74 is patterned on the silicon semiconductor substrate 71 to demarcate element active regions.

The gate oxide film 75 is formed on the entire surface of the silicon semiconductor substrate 71. An undoped polysilicon film is deposited on the gate oxide film 75 by CVD or the like.

P- and n-type impurities are sequentially doped into the polysilicon film in the following manner.

A photoresist is applied over the n-type well 72 to form a resist mask by photolithography. While the structure on the n-type well 72 is covered with this resist mask, an n-type impurity such as phosphorus or arsenic is ion-implanted into the surface region of the polysilicon film on the side of the p-type well 73, thereby forming an n-type region in the polysilicon film.

The resist mask is removed by ashing or the like. A photoresist is applied over the p-type well 73 to form a resist mask by photolithography. While the structure on the p-type well 73 is covered with this resist mask, a p-type impurity such as boron is ion-implanted into the surface region of the polysilicon film on the side of the n-type well 72, thereby forming a p-type region in the polysilicon film.

The resist mask is removed by ashing or the like. A silicide film consisting of a refractory metal such as WSi is deposited on the polysilicon film by sputtering.

The silicide film, the polysilicon film, and the gate oxide film 75 are subjected to photolithography and dry etching or the like. With this process, the gate oxide film 75 and the p-type polycide layer 81 constituted by the p-type gate electrode 85 and the silicide film 87 are formed in the element active region on the n-type well 72. The gate oxide film 75 and the n-type polycide layer 83 constituted by the n-type gate electrode 86 and the silicide film 88 are formed in the element active region on the p-type well 73. The p-type polycide layer 81 and the n-type polycide layer 83 are isolated on the field shield element isolation structure 74.

A resist mask is formed on the n-type well 72 side. While the structure on the n-type well 72 is covered with this resist mask, an n-type impurity such as phosphorus or arsenic is ion-implanted into the surface region of the p-type well 73 on both sides of the n-type polycide layer 83 with using the n-type polycide layer 83 as a mask.

A resist mask is formed on the p-type well 73 side. While the structure on the p-type well 73 is covered with this resist mask, a p-type impurity such as boron is ion-implanted into the surface region of the n-type well 72 on both sides of the p-type polycide layer 81 with using the p-type polycide layer 81 as a mask.

The silicon semiconductor substrate 71 is subjected to predetermined annealing, so that the pair of p-type impurity diffusion layers 82 are formed in the n-type well 72, and the pair of n-type impurity diffusion layers 84 are formed in the p-type well 73.

As shown in FIGS. 8B and 8E, the insulating interlayer 90 consisting of a BPSG film is deposited on the entire surface by CVD or the like. The surface of the insulating interlayer 90 is polished by so-called chemical mechanical polishing (CMP) until the surfaces of the silicide films 87 and 88 of the p- and n-type polycide layer 81 and 83 are exposed.

The contact holes 91 are formed in the insulating interlayer 90 by photolithography and dry etching to partially expose the surfaces of the p- and n-type impurity diffusion layers 82 and 84.

As shown in FIGS. 8C and 8F, a refractory and conductive TiSiN film 89 containing silicon is deposited on the entire surface by sputtering or the like. Instead of TiSiN, WSiN may be used.

The TiSiN film 89 is subjected to photolithography and dry etching to form the diffusion prevention film 89a integrally formed on the silicide films 87 and 88 for electrically connecting the p-type polycide layer 81 and the n-type polycide layer 83, the diffusion prevention film 89b for electrically connecting, through the contact holes 91, the p- and n-type impurity diffusion layers 82 and 84 serving as drains which are adjacent to each other with the field shield element isolation structure 74 interposed therebetween, and the diffusion prevention film 89c for electrically connecting the p- and n-type impurity diffusion layers 82 and 84 serving as sources through the contact holes 91.

An insulating interlayer (not shown) consisting of a BPSG film is deposited on the entire surface by CVD or the like. The insulating interlayer is reflowed by annealing at a predetermined temperature of 900° C. or more to planarize the surface of the insulating interlayer.

Thereafter, predetermined contact holes and various wiring layers (none are shown) are formed, thus completing the CMOS inverter.

As described above, in the method of manufacturing the CMOS inverter of the third embodiment, the refractory and conductive diffusion prevention films 89b and 89c containing silicon are formed as diffusion prevention films for preventing interdiffusion of the p- and n-type impurities in the p- and n-type impurity diffusion layers 82 and 84. The p-type polycide layer 81 and the n-type polycide layer 83 are electrically connected through the diffusion prevention film 89a. The diffusion prevention films 89a to 89c have an excellent heat resistance and never suffer peel-off or junction leakage even in high-temperature annealing. Therefore, even when a semiconductor device which requires high-temperature annealing after formation of the polycide layer and the diffusion prevention films 89a to 89c, e.g., a dual-gate CMOS inverter having gate electrodes formed from polycide layers of opposite conductivity types is to be formed as in this embodiment, disadvantages due to high-temperature annealing can be prevented, including non-ohmic contact between the impurity diffusion layers 82 and 84 of opposite conductivity types, destruction of barrier properties of the diffusion prevention film, and an increase in resistance.

Fourth Embodiment

The fourth embodiment will be described next. In the fourth embodiment, a DRAM having a memory cell constituted by a MOS transistor serving as an access transistor and a memory capacitor, and an output transistor for fixing the potential of the cell plate electrode of the memory capacitor at a predetermined value, and a method of manufacturing the DRAM will be exemplified. As a memory cell, the memory cell described in the first embodiment will be exemplified. The same reference numerals as in the DRAM of the first embodiment denote the same pars in the fourth embodiment.

Figure 9:
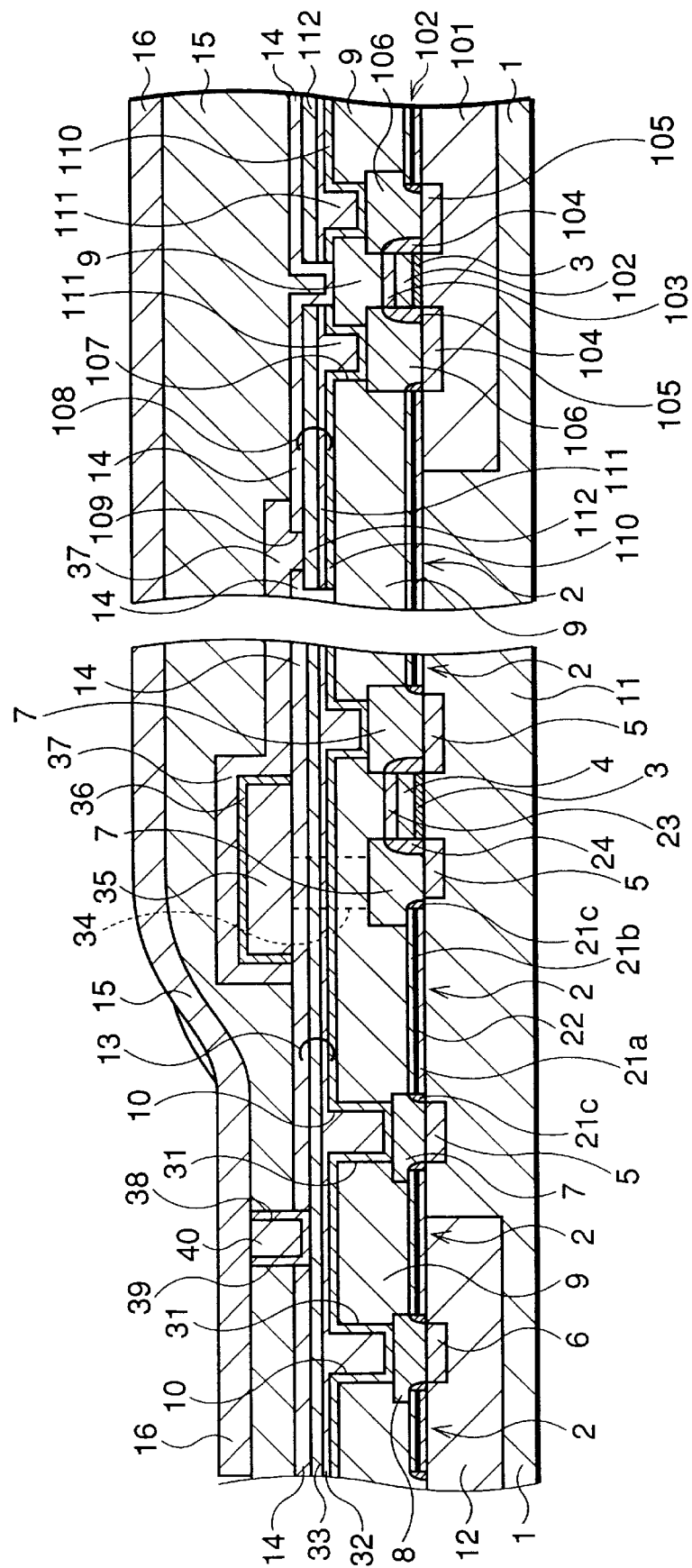
FIG. 9 is a schematic sectional view showing a DRAM according to the fourth embodiment of the present invention.

FIG. 9 is a schematic sectional view showing the main portion of the memory cell region, part of the peripheral circuit region, and the main portion of the output transistor of the DRAM according to the fourth embodiment. This DRAM has a so-called COB (Capacitor Over Bitline) structure in which a memory capacitor is substantially formed above a bit line in the memory cell region. This DRAM has, in its memory cell region, an access transistor and a memory capacitor electrically connected to one of a pair of impurity diffusion layers of the access transistor, and in its peripheral circuit region, a MOS transistor having a pair of impurity diffusion layers of a conductivity type opposite to that of the impurity diffusion layers of the access transistor. The DRAM also has an output transistor connected to the cell plate electrode of the memory capacitor.

The access transistor in the memory cell region is an nMOS transistor formed on a p-type well 11 formed in a p-type silicon semiconductor substrate 1. The nMOS transistor is formed in an element active region demarcated by a field shield element isolation structure 2 on the p-type well 11.

The MOS transistor in the peripheral circuit region is a pMOS transistor formed on an n-type well 12 formed in the silicon semiconductor substrate 1. The pMOS transistor is formed in an element active region (not shown) demarcated by the field shield element isolation structure 2 on the n-type well 12.

The field shield element isolation structure 2 is formed in the following manner. A shield plate electrode 22 consisting of a polysilicon film is patterned on a shield gate oxide film 21a formed by thermally oxidizing the silicon semiconductor substrate 1. A cap insulating film 21b consisting of a silicon oxide film is formed on the upper surface of the shield plate electrode 22, and a side wall protective film 21c consisting of the silicon oxide film is formed on the side surface of the shield plate electrode 22, so that the shield plate electrode 22 is buried in the silicon oxide films. The field shield element isolation structure 2 has a function of electrically isolating element active regions from each other by fixing the potential of the shield plate electrode 22. Instead of the field shield element isolation structure 2, a field oxide film may be formed by so-called LOCOS as an element isolation structure for demarcating element active regions.

In the memory cell region, gate oxide films 3 are formed in the element active regions on the p-type well 11 and the n-type well 12 of the silicon semiconductor substrate 1, and a gate electrode 4 consisting of polysilicon and having a predetermined pattern is formed on each gate oxide film 3. A cap insulating film 23 is formed on the upper surface of the gate electrode 4, and a side wall protective film 24 as an insulating film is formed on the side surface of the gate electrode 4, so that the gate electrode 4 is covered with the cap insulating film 23 and the side wall protective film 24.

In the peripheral circuit region as well, the gate electrode 4 is patterned on the gate oxide film 3, as in the memory cell region, although not illustrated.

N-type impurity diffusion layers 5 serving as source and drain diffusion layers are formed in the surface region of the silicon semiconductor substrate 1 on both sides of each gate electrode 4 formed on the p-type well 11. In addition, p-type impurity diffusion layers 6 serving as source and drain diffusion layers are formed in the surface region of the silicon semiconductor substrate 1 on both side of each gate electrode 4 on the n-type well 12. The gate electrode 4 and the pair of n-type impurity diffusion layers 5 form the nMOS transistor, i.e., the access transistor in the memory cell region, and the gate electrode 4 and the pair of p-type impurity diffusion layers 6 form the pMOS transistor, i.e., the MOS transistor in the peripheral circuit region.

To relax the positional accuracy in formation of contact holes in the n- and p-type impurity diffusion layers 5 and 6, n- and p-type pad polysilicon films 7 and 8 for extracting contacts are patterned on the surface of the silicon semiconductor substrate 1 where the n- and p-type impurity diffusion layers 5 and 6 are formed. More specifically, an n-type impurity is doped in the silicon semiconductor substrate 1 through an undoped pad polysilicon film in the memory cell region, and a p-type impurity is doped in the silicon semiconductor substrate 1 through an undoped pad polysilicon film in the peripheral circuit region, thereby forming the pad polysilicon films 7 and 8 and simultaneously the n- and p-type impurity diffusion layers 5 and 6. These pad polysilicon films 7 and 8 extend from the cap insulating film 23 and the side wall protective film 24, which cover each gate electrode 4, to the field shield element isolation structure 2 or the space between the field shield element isolation structures 2. The pad polysilicon films 7 and 8 are isolated from each other on the cap insulating film 23 and the side wall protective film 24 or the field shield element isolation structure 2.

An insulating interlayer 9 consisting of a BPSG film (boro-phospho silicate glass film) is formed on the entire surface of the memory cell region and the peripheral circuit region. The pad polysilicon films 7 are buried in the insulating interlayer 9. Contact holes 10 serving as bit contacts are formed in the insulating interlayer 9 to partially expose the surface of the n-type pad polysilicon film 7 formed on one of the pair of n-type impurity diffusion layers 5 in the memory cell region and the surface of the p-type pad polysilicon film 8 formed on one of the pair of p-type impurity diffusion layers 6 in the peripheral circuit region. A polycide wiring layer 13 serving as a bit line is patterned on the insulating interlayer 9 to fill the contact hole 10.

The polycide wiring layer 13 has a two-layer structure in which a silicide film 33 of a refractory metal is stacked on an n-type (or p-type) polysilicon film 32. The polycide wiring layer 13 is formed on the insulating interlayer 9 with a refractory and conductive diffusion prevention film 31 serving as an underlying film intervened therebetween.

The diffusion prevention film 31 is an underlying film consisting of TiSiN or WSiN containing silicon. The diffusion prevention film 31 covers the surface of the insulating interlayer 9 and the inner wall (i.e., the side wall corresponding to the exposed surface of the insulating interlayer 9 and the bottom surface corresponding to the exposed surface of the pad polysilicon film 7 or 8) of each contact hole 10. The polycide wiring layer 13 is formed on the diffusion prevention film 31. The diffusion prevention film 31 prevents interdiffusion of the n-type impurity in the n-type impurity diffusion layers 5 (and the n-type pad polysilicon films 7 connected to the n-type impurity diffusion layers 5) in the memory cell region and the p-type impurity in the p-type impurity diffusion layers 6 (and the pad polysilicon films 8 connected to the p-type impurity diffusion layers 6) in the peripheral circuit region. The polycide wiring layer 13 is electrically connected to one of the pair of n-type impurity diffusion layers 5 in the memory cell region and one of the pair of p-type impurity diffusion layers 6 in the peripheral circuit region through the diffusion prevention film 31 and the pad polysilicon films 7 and 8 to serve as a bit line.

A cap insulating film 14 is deposited to cover the polycide wiring layer 13. In the memory cell region, a contact hole 34 serving as a storage contact is formed in the cap insulating film 14 and the insulating interlayer 9 to partially expose the surface of the n-type pad polysilicon film 7 formed on the other of the pair of n-type impurity diffusion layers 5 which is not connected to the polycide wiring layer 13. The memory capacitor in the memory cell region is formed on the cap insulating film 14.

The memory capacitor is formed by sequentially forming a storage node electrode 35 consisting of polysilicon, a dielectric film 36 consisting of, e.g., an ONO composite film, and a cell plate electrode 37 consisting of polysilicon and patterning these films into a predetermined shape. The storage node electrode 35 and the cell plate electrode 37 are conductive thin films formed by doping an n-type impurity such as phosphorus (P) or arsenic (As) into undoped polysilicon films. The storage node electrode 35 fills the contact hole 34 and is electrically connected to the other of the pair of n-type impurity diffusion layers 5 through the n-type pad polysilicon film 7.

An insulating interlayer 15 consisting of a BPSG film is deposited on the memory capacitor and the cap insulating film 14 to cover the memory capacitor. A contact hole 38 is formed in the insulating interlayer 15 and the cap insulating film 14 to partially expose the surface of the silicide film 33 of the polycide wiring layer 13.

An underlying protective film 39 consisting of TiN is formed on the inner wall (i.e., the side wall corresponding to the exposed surface of the insulating interlayer 15 and the bottom surface corresponding to the exposed surface of the silicide film 33) of the contact hole 38. In addition, a tungsten plug (W plug) 40 is formed to fill the contact hole 38 with the underlying protective film 39 intervened.

An aluminum wiring layer 16 consisting of, e.g., an aluminum alloy is patterned on the entire surface of the insulating interlayer 15 including the exposed upper surface of the W plug 40. The aluminum wiring layer 16 is electrically connected to the polycide wiring layer 13 through the W plug 40.

The output transistor constitutes a so-called ½ Vcc generation circuit. The output transistor is a pMOS transistor formed in an element active region demarcated by the field shield element isolation structure 2 on an n-type well 101 of the silicon semiconductor substrate 1. In this output transistor, the gate oxide film 3 is formed in the element active region on the n-type well 101 of the silicon semiconductor substrate 1, and a gate electrode 102 consisting of polysilicon and having a predetermined pattern is formed on the gate oxide film 3. A cap insulating film 103 is formed on the upper surface of the gate electrode 102, and a side wall protective film 104 as an insulating film is formed on the side surface of the gate electrode 102, so that the gate electrode 102 is covered with the cap insulating film 103 and the side wall protective film 104.

P-type impurity diffusion layers 105 serving as source and drain diffusion layers are formed in the surface region of the silicon semiconductor substrate 1 on both sides of the gate electrode 102 formed on the n-type well 101. The gate electrode 102 and the pair of p-type impurity diffusion layers 105 form the pMOS transistor, i.e., the output transistor.

Figure 10:
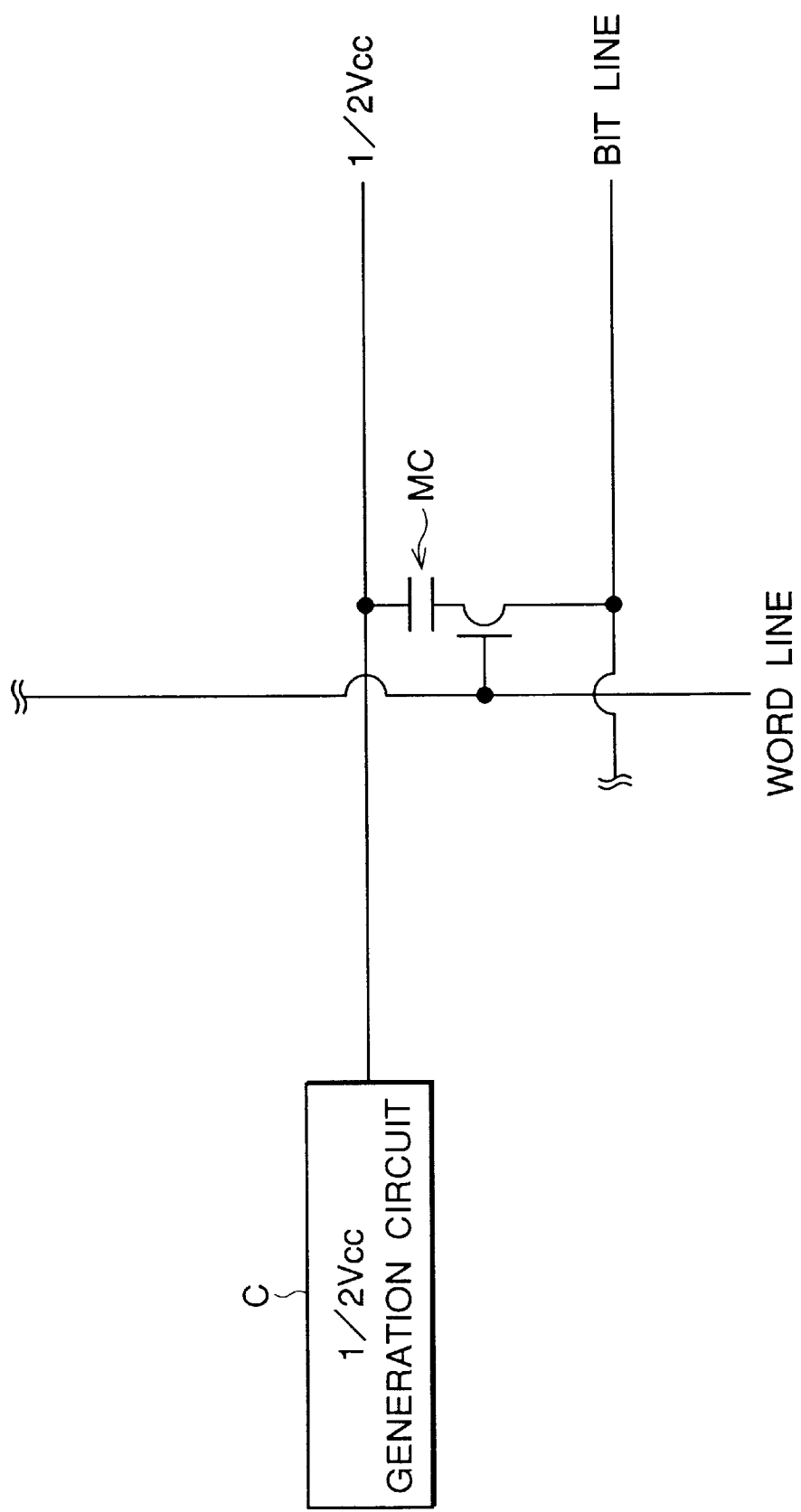
FIG. 10 is a circuit diagram showing an equivalent circuit of the DRAM according to the fourth embodiment of the present invention.

FIG. 10 shows connection of the DRAM of this embodiment having the output transistor. A ½ Vcc generation circuit C having the output transistor is connected to a memory capacitor MC (cell plate electrode) of each memory cell M constituting the memory cell array, so that the potential of the cell plate electrode is fixed at ½ Vcc.

To relax the positional accuracy in formation of contact holes in the impurity diffusion layers 105, p-type pad polysilicon films 106 for extracting contacts are patterned on the surface of the silicon semiconductor substrate 1 where the impurity diffusion layers 105 are formed. More specifically, a p-type impurity is doped in the silicon semiconductor substrate 1 through an undoped pad polysilicon film in the element active region, thereby forming the p-type pad polysilicon films 106 and simultaneously the p-type impurity diffusion layers 105. The pad polysilicon films 106 are formed to bury the space between the cap insulating film 103 and the side wall protective film 104, which cover the gate electrode 102, and the field shield element isolation structure 2. The pad polysilicon films 106 are isolated from each other on the cap insulating film 103 and the side wall protective film 104.

The insulating interlayer 9 is formed on the entire surface to bury the p-type pad polysilicon films 106. Contact holes 107 are formed in the insulating interlayer 9 to partially expose the surface of the p-type pad polysilicon film 106 formed on at least one of the pair of p-type impurity diffusion layers 105. A polycide wiring layer 108 is patterned on the insulating interlayer 9 to fill the contact holes 107.

The polycide wiring layer 108 is formed by stacking a polysilicon film 111 and a silicide film 112 of a refractory metal on the insulating interlayer 9 with a refractory and conductive diffusion prevention film, i.e., a diffusion prevention film 110 consisting of TiSiN or WSiN, intervened. The cap insulating film 14 is formed to cover the upper surface of the polycide wiring layer 108. The polycide wiring layer 108 is connected to the cell plate electrode 37 through a contact hole 109 formed in the cap insulating film 14 under the cell plate electrode 37 of the memory capacitor formed in the memory cell region.

The output transistor has a function of fixing the potential of the cell plate electrode 37 connected to the output transistor through the wiring layer 108 at a predetermined value, i.e., ½ Vcc in this embodiment.

As described above, in the DRAM of the fourth embodiment, the refractory and conductive diffusion prevention film 31 containing silicon is formed as a diffusion prevention film for preventing interdiffusion of the n- and p-type impurities in the n- and p-type impurity diffusion layers 5 and 6. The polycide wiring layer 13 is electrically connected to the impurity diffusion layers 5 and 6 through the diffusion prevention film 31. The diffusion prevention film 31 has an excellent heat resistance and never suffer peel-off or junction leakage even in high-temperature annealing. Therefore, even when a semiconductor device which requires high-temperature annealing after formation of the polycide wiring layer 13 and the diffusion prevention film 31, e.g., a DRAM having a COB structure using the polycide wiring layer 13 as a bit line is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

In addition, in the DRAM of the fourth embodiment, the polycide wiring layer 108 for connecting the cell plate electrode 37 of the memory capacitor formed in the memory cell region and one of the pair of p-type impurity diffusion layers 105 of the output transistor is formed as a polycide wiring layer having the refractory and conductive diffusion prevention film 110 containing silicon as an underlying film. The diffusion prevention film 110 has a function of preventing interdiffusion of the n-type impurity in the cell plate electrode 37 and the p-type impurity in the p-type impurity diffusion layer 105. The diffusion prevention film 110 also has an excellent heat resistance and never suffer peel-off or junction leakage even in high-temperature annealing. Therefore, even when a semiconductor device which requires high-temperature annealing after formation of the polycide wiring layer 108, e.g., a DRAM having a COB structure using the polycide wiring layer 108 is to be formed as in this embodiment, disadvantages due to high-temperature annealing can be prevented, including non-ohmic contact between the cell plate electrode 37 and the impurity diffusion layer 5, which have opposite conductivity types, destruction of barrier properties of the diffusion prevention film, and an increase in resistance.

The method of manufacturing the DRAM of the fourth embodiment will be described next. FIGS. 11A to 11F are schematic sectional views showing steps in manufacturing the DRAM. The same reference numerals as in FIG. 9 denote the same parts in FIGS. 11A to 11F.

Figure 11A:
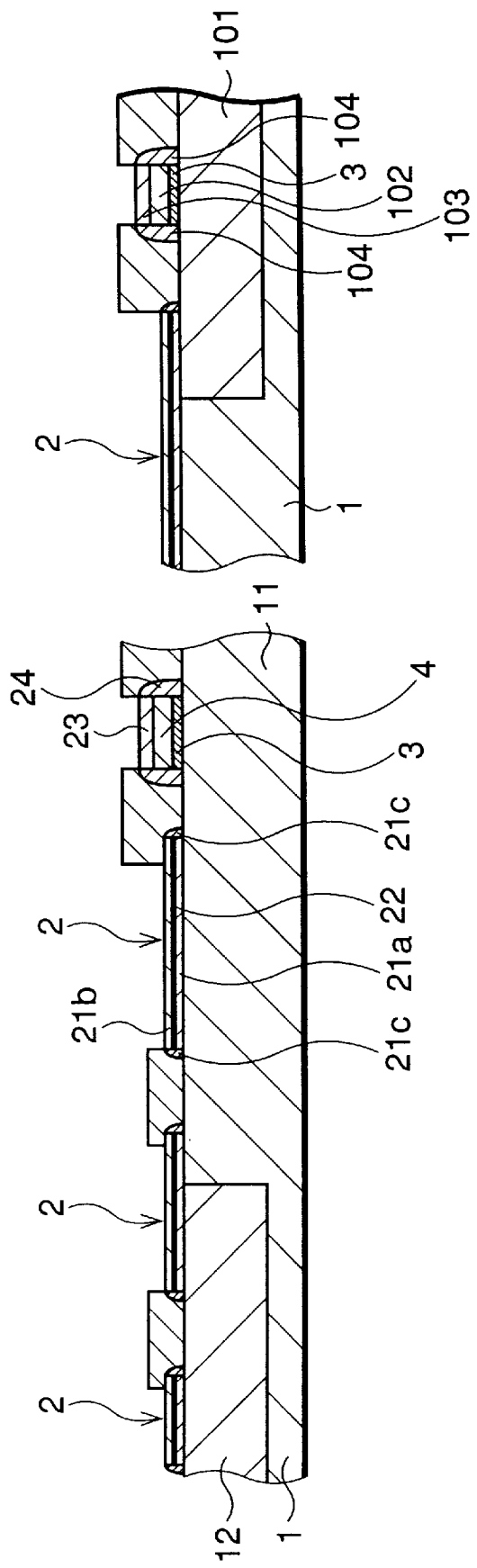

As shown in FIG. 11A, an n-type impurity is doped into the surface region of the p-type silicon semiconductor substrate 1 to form the n-type wells 12 and 101 each having an island-shape. The region of the silicon semiconductor substrate 1 outside the n-type wells 12 and 101 becomes the p-type well 11. The peripheral circuit region is formed on the n-type well 12, the memory cell region is formed on the p-type well 11, and the output transistor circuit region is formed on the n-type well 101.

The field shield element isolation structure 2 is formed on the surface of the silicon semiconductor substrate 1. The element active regions in the memory cell region, the peripheral circuit region, and the output transistor circuit region are demarcated by the field shield element isolation structure 2.

More specifically, a shield gate oxide film 21a is formed by thermally oxidizing the surface of the silicon semiconductor substrate 1 in the memory cell region, the peripheral circuit region, and the output transistor circuit region. Thereafter, the polysilicon film 22 and the silicon oxide film 21b are sequentially formed.

The shield gate oxide film 21a, the polysilicon film 22, and the silicon oxide film 21b are patterned and selectively removed by photolithography and dry etching or the like, thereby demarcating the element active regions.

A silicon oxide film is formed on the entire surface to cover the left shield gate oxide film 21a, polysilicon film 22, and silicon oxide film 21b. The entire surface is anisotropically dry-etched by RIE or the like to leave the silicon oxide on the side surfaces of the shield gate oxide film 21a, the polysilicon film 22, and the silicon oxide film 21b, thereby forming the side wall protective film 21c.

With this process, the field shield element isolation structure 2 having the shield plate electrode 22 consisting of a polysilicon film surrounded by the silicon oxide film is formed in the memory cell region, the peripheral circuit region, and the output transistor circuit region.

In each of the element active regions in the memory cell region, the peripheral circuit region, and the output transistor circuit region, the gate oxide film 3 is formed by thermally oxidizing the surface of the silicon semiconductor substrate 1, CVD, or the like. A polysilicon film is deposited on the entire surface of the gate oxide films 3 by CVD or the like and patterned by photolithography and dry etching or the like. With this process, the gate electrode 4 is formed on the gate oxide film 3 in the memory cell region, and the gate electrode 102 is formed on the gate oxide film 3 in the output transistor circuit region.

A silicon oxide film is deposited on the entire surface by CVD or the like to cover the gate electrodes 4 and 102. The entire surface of the silicon oxide film is anisotropically dry-etched by RIE or the like to leave the silicon oxide film only on the upper and side surfaces of the gate electrodes 4 and 102, thereby forming the cap insulating film 23 and the side wall protective film 24 to cover the gate electrode 4, and the cap insulating film 103 and the side wall protective film 104 to cover the gate electrode 102. At the same time, the gate oxide films 3 between the gate electrodes 4 or 102, between the field shield element isolation structures 2, and between each of the gate electrodes 4 and 102 and the field shield element isolation structure 2 are removed to expose the surface of the silicon semiconductor substrate 1 at these portion.

An undoped polysilicon film is deposited on the entire surface by CVD and patterned by photolithography and dry etching or the like to remove the polysilicon film on the cap insulating films 23 and 103 and the field shield element isolation structure 2. At this time, pad polysilicon films are formed to be electrically connected to the surface of the silicon semiconductor substrate 1 between the gate electrodes 4 or 102, between the field shield element isolation structures 2, and between each gate electrode 4 or 102 and the field shield element isolation structure 2 and also to be electrically isolated from each other on the cap insulating film 23 or 103 or the field shield element isolation structure 2.

Figure 11B:
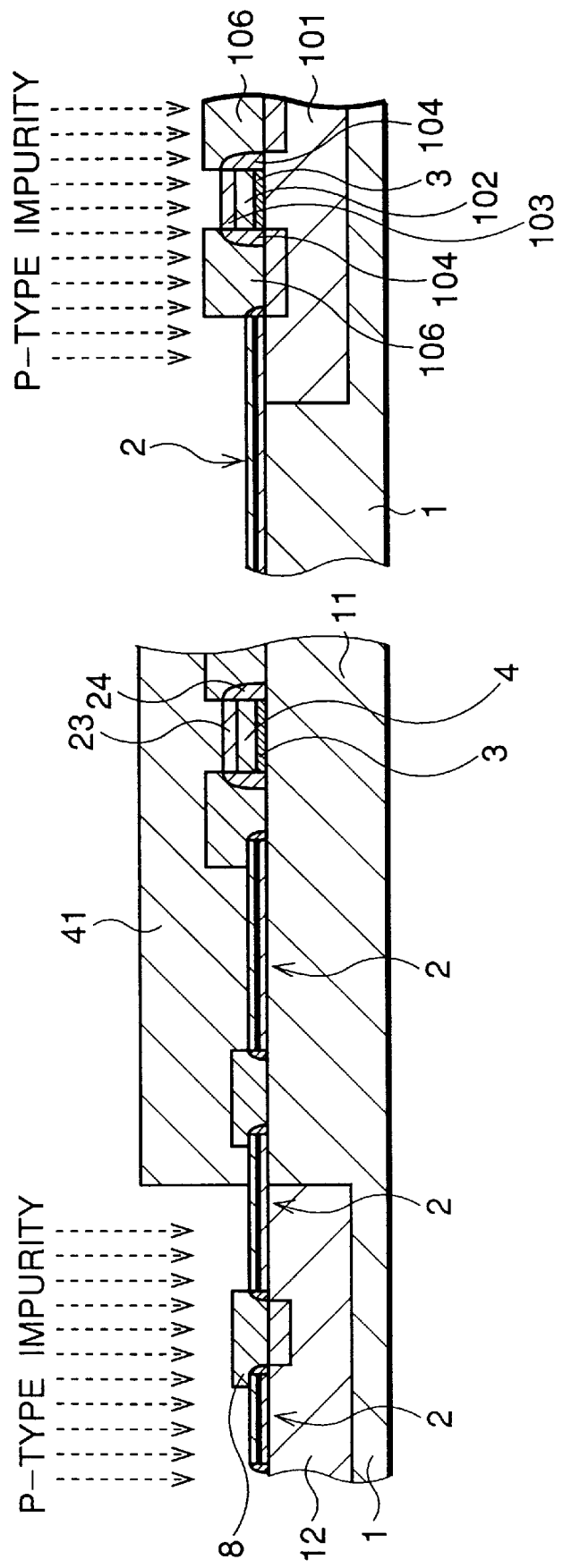

As shown in FIG. 11B, a photoresist is applied to the memory cell region side, i.e., over the p-type well 11 to form a resist mask 41. A p-type impurity such as boron is ion-implanted into the pad polysilicon films on the peripheral circuit region side (the n-type well 12 side) and the output transistor circuit region side (the n-type well 101 side) with using the resist mask 41 as a mask, thereby forming the p-type pad polysilicon films 8 and 106.

Figure 11C:
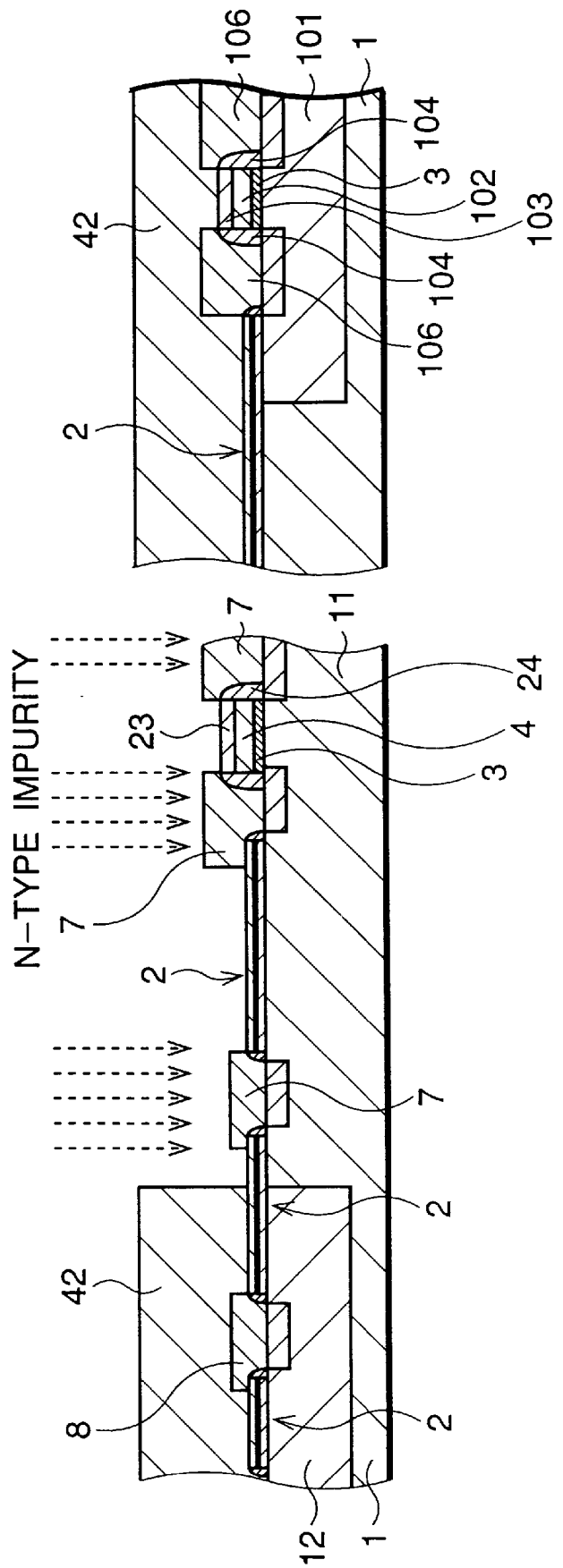

The resist mask 41 is removed by ashing or the like. As shown in FIG. 11C, a photoresist is applied to the peripheral circuit region side and the output transistor circuit region side, i.e., over the n-type wells 12 and 101 to form a resist mask 42. An n-type impurity such as phosphorus or arsenic is ion-implanted into the pad polysilicon film on the memory cell region side with using the resist mask 42 as a mask, thereby forming the n-type pad polysilicon film 7.

The resist mask 42 is removed by ashing or the like. Annealing is performed at 900° C. to 950° C. to diffuse the n-type impurity doped in the pad polysilicon film 7 and the p-type impurity doped in the pad polysilicon films 8 and 106 outward into the surface region of the silicon semiconductor substrate 1, thereby forming the n-type impurity diffusion layers 5 and p-type impurity diffusion layers 6 and 105.

As shown in FIG. 11, a BPSG film is deposited on the entire surface in the memory cell region, the peripheral circuit region, and the output transistor circuit region by atmospheric-pressure CVD to form the insulating interlayer 9. The insulating interlayer 9 is reflowed by annealing at a predetermined temperature of 900° C. or more to planarize the surface of the insulating interlayer 9.

The insulating interlayer 9 is subjected to photolithography and dry etching or the like to form the contact holes 10 serving as bit contacts to partially expose the surface of the n-type pad polysilicon film 7 formed on one of the pair of n-type impurity diffusion layers 5 in the memory cell region and the surface of the p-type pad polysilicon film 8 formed on one of the pair of p-type impurity diffusion layers 6 in the peripheral circuit region, and the contact holes 107 to partially expose the surface of the p-type pad polysilicon film 106 formed on at least one of the pair of p-type impurity diffusion layers 105 (in FIG. 11D, the p-type pad polysilicon films 106 are formed on both the p-type impurity diffusion layers 105) in the output transistor circuit region.

An underlying film consisting of TiSiN or WSiN containing silicon is deposited by sputtering to cover the surface of the insulating interlayer 9 and the inner wall of each of the contact holes 10 and 107.

An n-type polysilicon film is deposited on the underlying film by low-pressure CVD to fill the contact holes 10 and 107 with the underlying film intervened. A silicide film of a refractory metal is deposited on the polysilicon film by sputtering. When the polysilicon film is to be formed, an undoped polysilicon film is formed while flowing, e.g., PH$_3$ gas to dope phosphorus (P) in the polysilicon film.

The resultant silicide film, polysilicon film, and underlying film are patterned into a predetermined shape by photolithography and dry etching or the like. With this process, the diffusion prevention film 31 is patterned from the underlying film, and the polycide wiring layer 13 having a two-layer structure of the silicide film 33 and the polysilicon film 32 is formed on the diffusion prevention film 31. At the same time, the diffusion prevention film 110 obtained by patterning the underlying film, and the polycide wiring layer 108 having a two-layer structure of the silicide film 112 and the polysilicon film 111 on the diffusion prevention film 110 are formed into a shape isolated on the insulating interlayer 9 formed over the gate electrode 102.

Figure 11E:
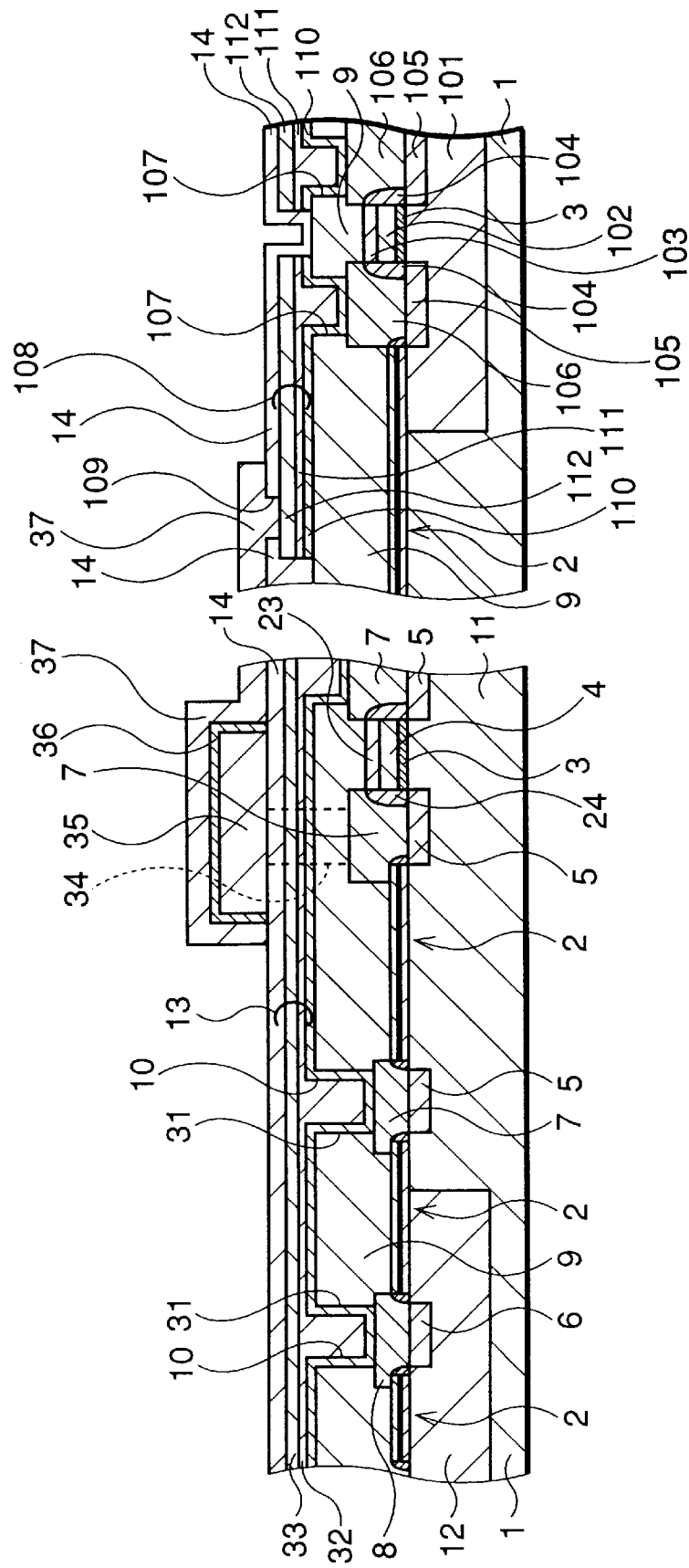

As shown in FIG. 11E, the cap insulating film 14 consisting of, e.g., SiO$_2$ is deposited by CVD or the like to cover the polycide wiring layers 13 and 108. In the memory cell region, a memory capacitor is formed on the cap insulating film 14 in the following manner.

The contact hole 34 serving as a storage contact is formed in the cap insulating film 14 and the insulating interlayer 9 by photolithography and dry etching or the like to partially expose the surface of the n-type pad polysilicon film 7 formed on the other of the pair of n-type impurity diffusion layer 5 which is not connected to the polycide wiring layer 13 in the memory cell region. Simultaneously, the contact hole 109 is formed in the cap insulating film 14 to partially expose the surface of the polycide wiring layer 108.

While the structure on the output transistor circuit region side is covered with a resist mask (not shown), a polysilicon film is deposited on the cap insulating film 14 including the inside of the contact hole 34 by CVD or the like. The storage node electrode 35 is patterned into a predetermined shape by photolithography and dry etching or the like.

An ONO composite film is formed to cover the storage node electrode 35 and healing-oxidized. Thereafter, the dielectric film 36 is patterned into a predetermined shape by photolithography and dry etching or the like.

The resist mask covering the structure on the output transistor circuit region side is removed by ashing or the like. A polysilicon film is deposited by CVD or the like to cover the dielectric film 36 on the memory cell region side and the cap insulating film 14 including the inside of the contact hole 109 on the output transistor circuit region side. The cell plate electrode 37 having a predetermined shape is formed by photolithography and dry etching or the like, thus completing a memory capacitor having the storage node electrode 35, the dielectric film 36, and the cell plate electrode 37. At this time, the cell plate electrode 37 of the memory capacitor is connected to the polycide wiring layer 108, so that the output transistor and the cell plate electrode 37 are rendered conductive through the diffusion prevention film 110 and the polycide wiring layer 108.

Figure 11F:
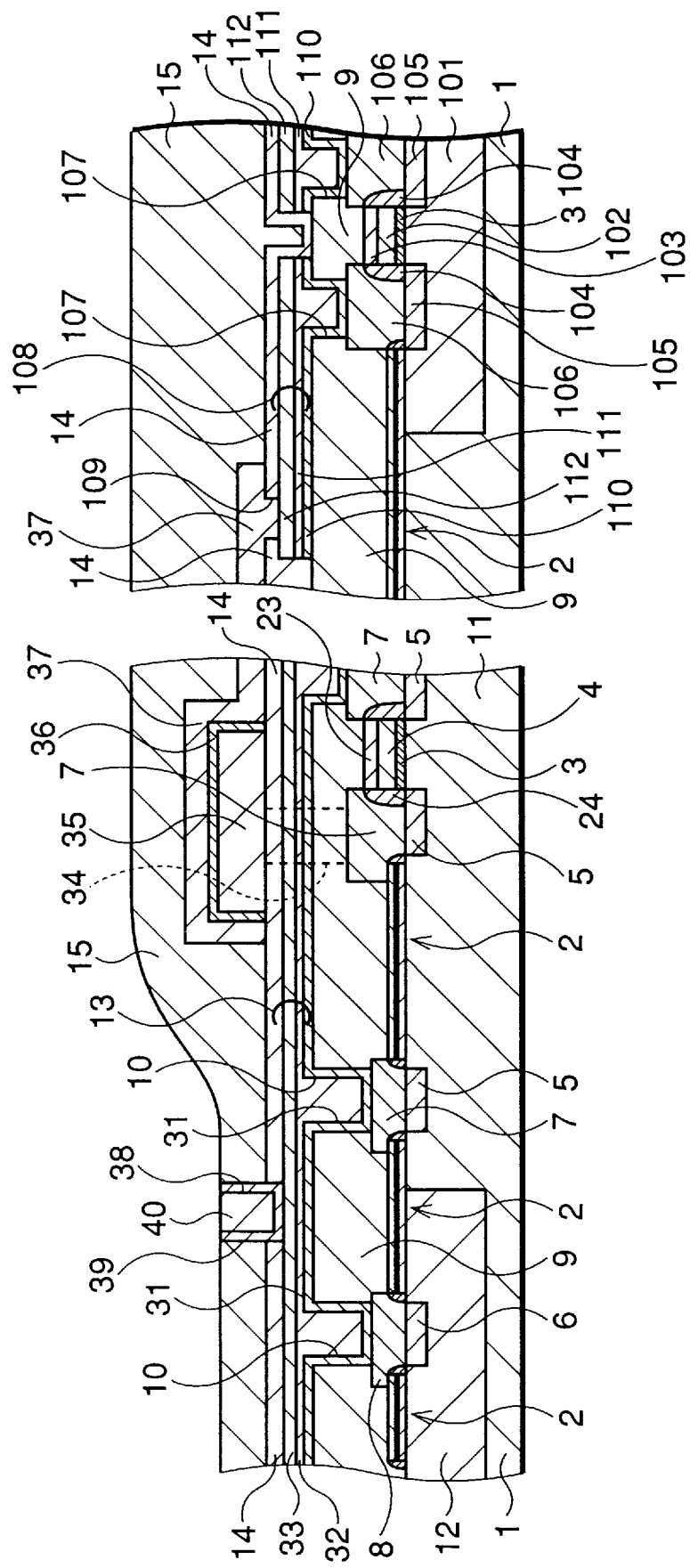

As shown in FIG. 11F, a BPSG film is deposited on the entire surface in the memory cell region, the peripheral circuit region, and the output transistor circuit region by atmospheric-pressure CVD to cover the memory capacitor, thereby forming the insulating interlayer 15. The insulating interlayer 15 is reflowed by annealing at a predetermined temperature of 900° C. or more to planarize the surface of the insulating interlayer 15.

The contact hole 38 is formed in the insulating interlayer 15 and the cap insulating film 14 by photolithography and dry etching or the like to partially expose the surface of the silicide film 33 of the polycide wiring layer 13.

A TiN film is formed by sputtering to cover the inner wall of the contact hole 38. Next, a tungsten film is formed by low-pressure CVD to fill the contact hole 38 with the TiN film intervened. The tungsten film and the TiN film are etched using a sulfur-fluoride-based etching gas to form the underlying protective film 39 formed from the TiN film left in the contact hole 38, and the W plug 40 filling the contact hole 38 with the underlying protective film 39 intervened.

An aluminum alloy film is deposited on the entire surface of the insulating interlayer 15 including the exposed upper surfaces of the W plug 40 and the underlying protective film 39 by sputtering. The aluminum alloy film is subjected to photolithography and dry etching or the like to pattern the aluminum wiring layer 16 electrically connected to the W plug 40 and the underlying protective film 39.

An insulating interlayer consisting of a BPSG film or the like is formed to cover the aluminum wiring layer 16, thus completing the DRAM.

As described above, in the method of manufacturing the DRAM of the fourth embodiment, the refractory and conductive diffusion prevention film 31 containing silicon is formed as a diffusion prevention film for preventing interdiffusion of the n- and p-type impurities in the n- and p-type impurity diffusion layers 5 and 6. The polycide wiring layer 13 is electrically connected to the impurity diffusion layers 5 and 6 through the diffusion prevention film 31. The diffusion prevention film 31 has an excellent heat resistance and never suffer peel-off or junction leakage even in high-temperature annealing. Therefore, even when a semiconductor device which requires high-temperature annealing at, e.g., 900° C. or more after formation of the polycide wiring layer 13 and the diffusion prevention film 31, e.g., a DRAM having a COB structure using the polycide wiring layer 13 as a bit line is to be formed as in this embodiment, disadvantages due to high-temperature annealing can be prevented, including non-ohmic contact between the impurity diffusion layers 5 and 6 of opposite conductivity types, destruction of barrier properties of the diffusion prevention film, and an increase in resistance.

In addition, in the method of manufacturing the DRAM of the fourth embodiment, the polycide wiring layer 108 for connecting the cell plate electrode 37 of the memory capacitor formed in the memory cell region and one of the pair of p-type impurity diffusion layers 105 of the output transistor is formed as a polycide wiring layer having the refractory and conductive diffusion prevention film 110 containing silicon as an underlying film. The diffusion prevention film 110 has a function of preventing interdiffusion of the n-type impurity in the cell plate electrode 37 and the p-type impurity in the p-type impurity diffusion layer 105. The diffusion prevention film 110 also has an excellent heat resistance and never suffer peel-off or junction leakage even in high-temperature annealing. Therefore, even when a semiconductor device which requires high-temperature annealing after formation of the polycide wiring layer 108, e.g., a DRAM having a COB structure using the polycide wiring layer 108 is to be formed as in this embodiment, disadvantages due to high-temperature annealing can be prevented, including non-ohmic contact between the cell plate electrode 37 and the impurity diffusion layer 5, which have opposite conductivity types, destruction of barrier properties of the diffusion prevention film, and an increase in resistance.

What is claimed is:

1. A semiconductor device in which a p-type well and an n-type well are formed in a semiconductor substrate, an n-channel transistor having an n-type impurity diffusion layer is formed in said p-type well, and a p-channel transistor having a p-type impurity diffusion layer is formed in said n-type well, comprising:

an insulating interlayer deposited over said semiconductor substrate and having openings for exposing surface portions of said n- and p-type impurity diffusion layers;

a refractory and conductive diffusion prevention film containing silicon, said diffusion prevention film covering a surface of said insulating interlayer including the inside of the openings to prevent interdiffusion of n- and p-type impurities;

a polycide wiring layer constituted by a polysilicon film deposited on said diffusion prevention film to fill the openings with said diffusion prevention film intervened and a silicide film deposited on said polysilicon film, said polycide wiring layer electrically connecting said n-type impurity diffusion layer and said p-type impurity diffusion layer and serves as a bit line; and a memory capacitor including a lower electrode connected to one of said n-type impurity diffusion layers and an upper electrode opposing said lower electrode with a dielectric therebetween, said memory capacitor being located at a higher level than said polycide wiring layer to form a COB structure.

2. A semiconductor device in which a p-type well and an n-type well are formed in a semiconductor substrate, comprising:

an n-type transistor, having a source and drain, formed in said p-well;

a p-type transistor, having a source and drain, formed in said n-well;

an insulating interlayer formed over said substrate and having openings for exposing surface portions of said source and drain of said n-type and said p-type transistors;

a refractory and conductive diffusion prevention film containing silicon, said diffusion prevention layer covering a surface of said insulating interlayer, including inside said openings, to prevent interdiffusion between said sources and drains of said n- and p-type transistors; and a polycide wiring layer including a polysilicon film formed on said diffusion prevention film to fill said openings and a silicide film formed on said polysilicon film, said polycide wiring layer electrically connecting one of said source and said drain of said n-type transistor to one of said source and said drain of said p-type transistor.

3. A semiconductor device in which a p-type well and an n-type well are formed in a semiconductor substrate, comprising:

an n-type transistor, having a source and drain, formed in said p-well;

a p-type transistor, having a source and drain, formed in said n-well;

an insulating interlayer formed over said substrate and having openings for exposing surface portions of said source and drain of said n-type and said p-type transistors;

a refractory and conductive diffusion prevention film containing silicon, said diffusion prevention layer covering a surface of said insulating interlayer, including inside said openings; and a polycide wiring layer including a polysilicon film formed on said diffusion prevention film to fill said openings and a silicide film formed on said polysilicon film, said polycide wiring layer electrically connecting one of said source and said drain of said n-type transistor to one of said source and said drain of said p-type transistor, whereby ohmic contact between said polycide wiring layer and said sources and drains is improved by said diffusion prevention film.

4. A device according to claim 2, further comprising:
a memory capacitor formed by patterning a lower electrode and an upper electrode, which sandwich a dielectric layer, said memory capacitor being formed on said polycide wiring layer with an insulating film intervened.

5. A device according to claim 4, further comprising polysilicon electrodes patterned in element active regions on said p- and n-type wells to be adjacent to gate electrodes of said transistors with an insulating film intervened therebetween,
wherein said sources and drains are formed by doping an n-type impurity into said polysilicon electrode on said p-type well and a p-type impurity into said polysilicon electrode on said n-type well, and said diffusion prevention film is electrically connected to surface portions of said polysilicon electrodes in the openings.

6. A device according to claim 2, wherein said diffusion prevention film essentially consists of one of TiSiN and WSiN.

7. A device according to claim 4, further comprising an output transistor having a gate electrode and a pair of impurity diffusion layers of a conductivity type opposite to that of said upper electrode of said memory capacitor, one of said pair of impurity diffusion layers being electrically connected to said upper electrode to fix said upper electrode at a predetermined potential,
wherein another refractory and conductive diffusion prevention film containing silicon is formed on one of an upper and lower surface of a wiring layer for connecting said one of said pair of impurity diffusion layers and said upper electrode.

8. A device according to claim 7, wherein said another diffusion prevention film essentially consists of one of TiSiN and WSiN.

9. A device according to claim 7, wherein said wiring layer is a polycide wiring layer having a two-layer structure of a polysilicon film and a silicide film.

10. A device according to claim 2, further comprising a heat-resistant insulating film covering at least said polycide wiring layer.

11. A device according to claim 10, wherein said heat-resistant insulating film is a BPSG film.

12. A semiconductor device in which a p-type well and an n-type well are formed in a semiconductor substrate, an n-channel transistor having an n-type impurity diffusion layer is formed in said p-type well, and a p-channel transistor having a p-type impurity diffusion layer is formed in said n-type well, comprising:
a first insulating interlayer deposited over said semiconductor substrate and having first openings for exposing surface portions of said n- and p-type impurity diffusion layers;
a first polycide wiring layer constituted by a first polysilicon film having an n conductivity type and patterned on said first insulating interlayer to fill the first opening for exposing said surface portion of said n-type impurity diffusion layer, and a first silicide film patterned on said first polysilicon film together with said first polysilicon film;
a second polycide wiring layer constituted by a second polysilicon film having an p conductivity type and patterned on said first insulating interlayer to fill the first opening for exposing said surface portion of said p-type impurity diffusion layer, and a second silicide film patterned on said second polysilicon film together with said second polysilicon film, said second polycide wiring layer being electrically isolated from said first polycide wiring layer on said first insulating interlayer;
a second insulating interlayer deposited over said first and second polycide wiring layers and having second openings for exposing surface portions of said first and second silicide films;
a refractory and conductive diffusion prevention film containing silicon, said diffusion prevention film covering at least inner walls of the second openings to prevent interdiffusion of n- and p-type impurities; and
an upper wiring layer deposited on said second insulating interlayer to fill the second openings with said diffusion prevention film intervened, said upper wiring layer being electrically connected to said n- and p-type impurity diffusion layers through said diffusion prevention film and said first and second polycide wiring layers.

13. A device according to claim 12, on at least one of said p- and n-type well in said semiconductor substrate, further comprising:
an access transistor constituted by one of pairs of n- and p-type impurity diffusion layers and a gate electrode patterned at a portion between one of said pairs of n- and p-type impurity diffusion layers on said semiconductor substrate with a gate insulating film intervened therebetween, said gate electrode being buried in said first insulating interlayer; and
a memory capacitor formed by patterning a lower electrode and an upper electrode, which sandwich a dielectric layer, said memory capacitor being formed on said one of first and second polycide wiring layer with an insulating film intervened.

14. A device according to claim 12, further comprising polysilicon electrodes patterned in element active regions on said p- and n-type wells,
wherein said n- and p-type impurity diffusion layers are formed by doping an n-type impurity into said polysilicon electrode on said p-type well and a p-type impurity into said polysilicon electrode on said n-type well, and said diffusion prevention film in the second opening is electrically connected to said polysilicon electrode through one of said first and second polycide wiring layers.

15. A device according to claim 12, wherein said diffusion prevention film essentially consists of one of TiSiN and WSiN.

16. A device according to claim 13, further comprising an output transistor having said gate electrode and a pair of impurity diffusion layers of a conductivity type opposite to that of said upper electrode of said memory capacitor, one of said pair of impurity diffusion layers being electrically connected to said upper electrode to fix said upper electrode at a predetermined potential,
wherein another refractory and conductive diffusion prevention film containing silicon is formed on one of an upper and lower surface of a wiring layer for connecting said one of said pair of impurity diffusion layers and said upper electrode.

17. A device according to claim 16, wherein said another diffusion prevention film essentially consists of one of TiSiN and WSiN.

18. A device according to claim 16, wherein said wiring layer is a polycide wiring layer having a two-layer structure of a polysilicon film and a silicide film.

19. A device according to claim 12, further comprising a heat-resistant insulating film covering at least said first and second polycide wiring layers.

20. A device according to claim 19, wherein said heat-resistant insulating film is a BPSG film.

21. A device according to claim 3, further comprising:

a memory capacitor formed by patterning a lower electrode and an upper electrode, which sandwich a dielectric layer, said memory capacitor being formed on said wiring layer with an insulating film intervened.

22. A device according to claim 3, further comprising polysilicon electrodes patterned in element active regions of said n-well and said p-well, wherein said sources and drains are formed by doping impurities of n and p conductivity types into said polysilicon electrodes, and said diffusion prevention film is electrically connected to surface portions of said polysilicon electrodes.

23. A device according to claim 3, wherein said diffusion prevention film essentially consists of one of TiSiN and WSiN.

24. A device according to claim 21, further comprising an output transistor having a gate electrode and a pair of third impurity diffusion layers of a conductivity type opposite to that of said upper electrode of said memory capacitor, one of said pair of third impurity diffusion layers being electrically connected to said upper electrode to fix said upper electrode at a predetermined potential, wherein another refractory and conductive diffusion prevention film containing silicon is formed on one of an upper and lower surface of a wiring layer for connecting said one of said pair of third impurity diffusion layers and said upper electrode.

25. A device according to claim 24, wherein said another diffusion prevention film essentially consists of one of TiSiN and WSiN.

26. A device according to claim 24, wherein said wiring layer is a polycide wiring layer having a two-layer structure of a polysilicon film and a silicide film.

27. A device according to claim 3, further comprising a heat-resistant insulating film covering at least said wiring layer.

28. A device according to claim 27, wherein said heat-resistant insulating film is a BPSG film.

29. A semiconductor device having a first region of a first conductivity type, a second region of a second conductivity type opposite to the first conductivity type, and first and second impurity diffusion layers formed by doping an impurity of the second conductivity type into an element active region of said first region and an impurity of the first conductivity type into an element active region of said second region, comprising:

a first insulating interlayer deposited over said semiconductor substrate and having first openings for exposing surface portions of said first and second impurity diffusion layers;

a first wiring layer constituted by a first conductive film having the second conductivity type and patterned on said first insulating interlayer to fill the first opening for exposing said surface portion of said first impurity diffusion layer, and a first silicide film patterned on said first conductive film together with said first conductive film;

a second wiring layer constituted by a second conductive film having the first conductivity type and patterned on said first insulating interlayer to fill the first opening for exposing said surface portion of said second impurity diffusion layer, and a second silicide film patterned on said second conductive film together with said second conductive film, said second wiring layer being electrically isolated from said first wiring layer on said first insulating interlayer;

a second insulating interlayer deposited over said first and second wiring layers and having second openings for exposing surface portions of said first and second silicide films;

a refractory and conductive diffusion prevention film containing silicon, said diffusion prevention film covering at least inner walls of the second openings to prevent interdiffusion of the impurities of the first and second conductivity types; and an upper wiring layer deposited on said second insulating interlayer to fill the second openings with said diffusion prevention film inervened, said upper wiring layer being electrically connected to said first and second impurity diffusion layers through said diffusion prevention film and said first and second wiring layers.

30. A device according to claim 29, wherein said first and second conductive films are polysilicon films, and said first and second wiring layers are polycide wiring layers.

31. A device according to claim 29, in said first region of said semiconductor substrate, further comprising:

an access transistor constituted by a pair of first impurity diffusion layers and a gate electrode patterned at a portion between said first impurity diffusion layers on said semiconductor substrate with a gate insulating film intervened therebetween, said gate electrode being buried in said first insulating interlayer; and a memory capacitor formed by patterning a lower electrode and an upper electrode, which sandwich a dielectric layer, said memory capacitor being formed on said first wiring layer with an insulating film intervened.

32. A device according to claim 29, further comprising polysilicon electrodes patterned in element active regions of said first and second regions, wherein said first and second impurity diffusion layers are formed by doping the impurities of the first and second conductivity types into said polysilicon electrodes, and said diffusion prevention film in the second opening is electrically connected to said polysilicon electrode through one of said first and second wiring layers.

33. A device according to claim 29, wherein said diffusion prevention film essentially consists of one of TiSiN and WSiN.

34. A device according to claim 31, further comprising an output transistor having said gate electrode and a pair of third impurity diffusion layers of a conductivity type opposite to that of said upper electrode of said memory capacitor, one of said pair of third impurity diffusion layers being electrically connected to said upper electrode to fix said upper electrode at a predetermined potential, wherein another refractory and conductive diffusion prevention film containing silicon is formed on one of an upper and lower surface of a third wiring layer for connecting said one of said pair of third impurity diffusion layers and said upper electrode.

35. A device according to claim 34, wherein said another diffusion prevention film essentially consists of one of TiSiN and WSiN.

36. A device according to claim 34, wherein said third wiring layer is a polycide wiring layer having a two-layer structure of a polysilicon film and a silicide film.

37. A device according to claim 29, further comprising a heat-resistant insulating film covering at least said first and second wiring layers.

38. A device according to claim 37, wherein said heat-resistant insulating film is a BPSG film.

39. A semiconductor device in which a p-type well and an n-type well are formed in a semiconductor substrate, an n-channel transistor having a first gate electrode structure and a pair of n-type impurity diffusion layers on both sides of said first gate electrode structure is formed in said p-type well, and a p-channel transistor having a second gate electrode structure and a pair of p-type impurity diffusion layers on both sides of said second gate electrode structure is formed in said n-type well, wherein said first gate electrode structure is constituted, as a polycide layer, by a first polysilicon film having an n conductivity type and a first silicide film patterned on said first polysilicon film together with said first polysilicon film, said second gate electrode structure is constituted, as a polycide layer, by a second polysilicon film having a p conductivity type and a second silicide film patterned on said second polysilicon film together with said second polysilicon film, said first and second gate electrode structures extending in a first direction, substantially parallel to each other, said first and second gate electrodes having end portions extending in a second direction to face each other, a refractory and conductive diffusion prevention film containing silicon is integrally formed on said first silicide film and said second silicide film to prevent interdiffusion of p- and n-type impurities, and said first gate electrode structure and said second gate electrode structure are electrically connected through said diffusion prevention film.

40. A device according to claim 39, further comprising another refractory and conductive diffusion prevention film containing silicon, said another diffusion prevention film electrically connecting one of said pair of n-type impurity diffusion layers and one of said pair of p-type impurity diffusion layers and electrically connecting the other of said pair of n-type impurity diffusion layers and the other of said pair of p-type impurity diffusion layers.

41. A device according to claim 40, wherein said diffusion prevention film and said another diffusion prevention film essentially consist of one of TiSiN and WSiN.

42. A device according to claim 39, further comprising a heat-resistant insulating film covering at least said diffusion prevention film.

43. A device according to claim 42, wherein said heat-resistant insulating film is a BPSG film.

44. A semiconductor device having a first region of a first conductivity type, a second region of a second conductivity type opposite to the first conductivity type, a first transistor having a first gate electrode structure and a pair of first impurity diffusion layers of the second conductivity type on both sides of said first gate electrode structure in said first region, and a second transistor having a second gate electrode structure and a pair of second impurity diffusion layers of the first conductivity type on both sides of said second gate electrode structure in said second region, wherein said first gate electrode structure is constituted by a first conductive film having the second conductivity type and a first silicide film patterned on said first conductive film together with said first conductive film, said second gate electrode structure is constituted by a second conductive film having the first conductivity type and a second silicide film patterned on said second conductive film together with said second conductive film, said first and second gate electrode structures extending in a first direction substantially parallel with each other and having end portions extending in a second direction to oppose each other, a refractory and conductive diffusion prevention film containing silicon is integrally formed on said first silicide film and said second silicide film to prevent interdiffusion of impurities of the first and second conductivity types, and said first gate electrode structure and said second gate electrode structure are electrically connected through said diffusion prevention film.

45. A device according to claim 44, wherein said first and second conductive films are polysilicon films, and said first and second gate electrode structures are polycide wiring layers.

46. A device according to claim 44, further comprising another refractory and conductive diffusion prevention film containing silicon, said another diffusion prevention film electrically connecting one of said pair of first impurity diffusion layers and one of said pair of second impurity diffusion layers and electrically connecting the other of said pair of first impurity diffusion layers and the other of said pair of second impurity diffusion layers.

47. A device according to claim 46, wherein said diffusion prevention film and said another diffusion prevention film essentially consist of one of TiSiN and WSiN.

48. A device according to claim 44, further comprising a heat-resistant insulating film covering at least said diffusion prevention film.

49. A device according to claim 48, wherein said heat-resistant insulating film is a BPSG film.

50. A semiconductor device comprising:

a plurality of memory cells each having
an access transistor including a first gate electrode and a pair of first impurity diffusion layers, and
a memory capacitor including a lower electrode connected to one of said pair of first impurity diffusion layers and an upper electrode opposing said lower electrode with a dielectric film intervened therebetween;

an output transistor having a second gate electrode and a pair of second impurity diffusion layers of a conductivity type opposite to that of said upper electrode of said memory capacitor;

a wiring layer for electrically connecting said upper electrode and one of said pair of second impurity diffusion layers of said output transistor, said wiring layer having a two-layer structure of a conductive film and a silicide film and being formed at a level below said memory capacitor; and a refractory and conductive diffusion prevention film containing silicon being formed on one of an upper and lower surface of said wiring layer to prevent interdiffusion between said first impurity diffusion layer and said second impurity diffusion layer and between said second impurity diffusion layer and said upper electrode, wherein said output transistor fixes said upper electrode at a predetermined potential.

51. A device according to claim 50, wherein said diffusion prevention film essentially consists of one of TiSiN and WSiN.

52. A device according to claim 50, wherein said conductive film is a polysilicon film, and said wiring layer is a polycide wiring layer.

53. A device according to claim 50, further comprising a heat-resistant insulating film covering at least said diffusion prevention film.

54. A device according to claim 53, wherein said heat-resistant insulating film is BPSG film.

55. A semiconductor device comprising:
- a first semiconductor layer arranged at a first level and containing a first impurity of a first conductivity type;
- a second semiconductor layer arranged at a second level, higher than said first level, and containing an impurity of a second conductivity type, opposite said first conductivity type; and
- a third semiconductor layer for connecting said first semiconductor layer and said second semiconductor layer,
- wherein said third semiconductor layer has a refractory and conductive diffusion prevention film containing silicon, said diffusion prevention film preventing at least interdiffusion of the first and second impurities.

56. A device according to claim 55, wherein one of said first and second semiconductor layers serves as an electrode of an capacitor, and the other is an impurity diffusion layer formed in a semiconductor substrate.

57. A device according to claim 55, wherein said diffusion prevention film essentially consists of one of TiSiN and WSiN.

58. A device according to claim 55, further comprising an insulating layer formed to cover said third semiconductor layer.

59. A device according to claim 58, wherein said insulating layer includes at least an insulating film for which annealing must be performed.

60. A device according to claim 59, wherein said insulating film is a BPSG film.

61. A device according to claim 3 wherein said diffusion prevention film is also formed on said surface portion of said source or drain.

62. A device according to claim 39, wherein said second direction is substantially perpendicular to said first direction.

63. A device according to claim 39, wherein said first and second gate electrodes are substantially L-shaped.

64. A device according to claim 39, wherein said diffusion prevention film is substantially C-shaped.

65. A device according to claim 44, wherein said second direction is substantially perpendicular to said first direction.

66. A device according to claim 44, wherein said first and second gate electrodes are substantially L-shaped.

67. A device according to claim 44, wherein said diffusion prevention film is substantially C-shaped.

* * * * *